US010961423B2

(12) United States Patent
Hitomi et al.

(10) Patent No.: US 10,961,423 B2
(45) Date of Patent: Mar. 30, 2021

(54) CURABLE COMPOSITION, THERMALLY CONDUCTIVE MATERIAL, AND DEVICE WITH THERMALLY CONDUCTIVE LAYER

(71) Applicant: FUJIFILM Corporation, Tokyo (JP)

(72) Inventors: Seiichi Hitomi, Kanagawa (JP); Keita Takahashi, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 16/533,816

(22) Filed: Aug. 7, 2019

(65) Prior Publication Data

US 2019/0359876 A1 Nov. 28, 2019

Related U.S. Application Data

(63) Continuation of application No. PCT/JP2018/004660, filed on Feb. 9, 2018.

(30) Foreign Application Priority Data

Feb. 9, 2017 (JP) ............................ JP2017-022318

(51) Int. Cl.

| | |
|---|---|
| ***C09K 5/14*** | (2006.01) |
| ***C08J 5/18*** | (2006.01) |
| ***C08L 35/02*** | (2006.01) |
| ***H01L 23/373*** | (2006.01) |

(52) U.S. Cl.

CPC .................. *C09K 5/14* (2013.01); *C08J 5/18* (2013.01); *C08L 35/02* (2013.01); *H01L 23/3737* (2013.01); *C08J 2335/02* (2013.01); *C08J 2433/14* (2013.01); *C08L 2203/16* (2013.01); *C08L 2205/025* (2013.01)

(58) Field of Classification Search

CPC . C09K 5/14; C08J 5/18; C08J 2335/02; C08J 2433/14; C08L 35/02; C08L 2203/16; C08L 2205/025; C08L 33/04; C09D 4/00; C08F 2/44; C08F 292/00; C08K 2003/385; C08K 3/00; C08K 2003/282; H01L 23/373; H01L 23/3737

See application file for complete search history.

(56) References Cited

U.S. PATENT DOCUMENTS

| | | | | |
|---|---|---|---|---|
| 2017/0247546 A1* | 8/2017 | Takahashi | ................ | C09C 1/00 |
| 2018/0327602 A1 | 11/2018 | Takahashi | | |

FOREIGN PATENT DOCUMENTS

| | | |
|---|---|---|
| JP | 2000239110 | 9/2000 |
| JP | 2003305946 | 10/2003 |
| JP | 2004358784 | 12/2004 |
| JP | 2006096973 | 4/2006 |
| JP | 2016066041 | 4/2016 |
| WO | 2013133281 | 9/2013 |
| WO | 2016084873 | 6/2016 |
| WO | 2017131006 | 8/2017 |

OTHER PUBLICATIONS

"International Search Report (Form PCT/ISA/210) of PCT/JP2018/004660," dated May 15, 2018, with English translation thereof, pp. 1-5.

"Written Opinion of the International Searching Authority (Form PCT/ISA/237) of PCT/JP2018/004660," dated May 15, 2018, with English translation thereof, pp. 1-9.

"Office Action of Korea Counterpart Application", dated Aug. 7, 2020, with English translation thereof, p. 1-p. 9.

* cited by examiner

*Primary Examiner* — Andrew J. Oyer
(74) *Attorney, Agent, or Firm* — JCIPRNET

(57) ABSTRACT

A first object of the present invention is to provide a curable composition capable of providing a cured substance in which an inorganic substance exhibits excellent dispersibility and which exhibits high thermal conductivity. A second object of the present invention is to provide a thermally conductive material formed by curing the curable composition and a device with a thermally conductive layer including the thermally conductive material.

The curable composition according to an embodiment of the present invention contains an inorganic substance selected from the group consisting of an inorganic nitride and an inorganic oxide, a compound which has a monovalent substituent selected from the group consisting of a boronic acid group, a boronic acid ester group, an aldehyde group, and a pyridinium group and has a molecular weight equal to or greater than 1,000, and a polymerizable monomer.

21 Claims, No Drawings

CURABLE COMPOSITION, THERMALLY CONDUCTIVE MATERIAL, AND DEVICE WITH THERMALLY CONDUCTIVE LAYER

CROSS-REFERENCE TO RELATED APPLICATIONS

This application is a Continuation of PCT International Application No. PCT/JP2018/004660 filed on Feb. 9, 2018, which claims priority under 35 U.S.C. § 119(a) to Japanese Patent Application No. 2017-022318 filed on Feb. 9, 2017. The above application is hereby expressly incorporated by reference, in its entirety, into the present application.

BACKGROUND OF THE INVENTION

1. Field of the Invention

The present invention relates to a curable composition, a thermally conductive material, and a device with a thermally conductive layer.

2. Description of the Related Art

In order to widen the range of applications of an inorganic nitride, a method of modifying the surface of the inorganic nitride has been suggested.

For example, WO2016/084873A discloses a method of modifying the surface of an inorganic nitride or an inorganic oxide with a boronic acid compound. Specifically, Example 2 in the document discloses a method of treating the surface of boron nitride, which is an inorganic nitride, with a polymerizable monomer having a boronic acid group.

SUMMARY OF THE INVENTION

In a case where an inorganic substance such as an inorganic nitride or an inorganic oxide is used by being mixed with an organic substance such as a resin binder, the inorganic substance is required to exhibit further improved affinity with the organic substance. For example, in a case where an inorganic nitride such as boron nitride is used as a thermally conductive material by being mixed with an organic substance, in view of further improving the thermal conductivity, the improvement of the dispersibility of the inorganic nitride in the organic substance is desired.

In line with this trend, based on Example 2 in WO2016/084873A, the inventors of the present invention prepared a curable composition containing an inorganic nitride whose surface was modified with a polymerizable monomer having a boronic acid group and a polymerizable monomer, and conducted examination regarding a cured substance of the curable composition. As a result, it was revealed that the dispersibility and the thermal conductivity of the inorganic nitride in the cured substance need to be further improved.

An object of the present invention is to provide a curable composition capable of providing a cured substance in which an inorganic substance exhibits excellent dispersibility and which exhibits high thermal conductivity.

Another object of the present invention is to provide a thermally conductive material formed by curing the curable composition and a device with a thermally conductive layer comprising the thermally conductive material.

In order to achieve the above objects, the inventors of the present invention conducted a thorough examination. As a result, the inventors have found that the objects can be achieved by using a compound, which has a specific functional group and has a molecular weight equal to or greater than a predetermined value, and accomplished the present invention.

That is, the inventors have found that the objects can be achieved by the following constitution.

[1] A curable composition comprising: an inorganic substance selected from the group consisting of an inorganic nitride and an inorganic oxide; a compound which has a monovalent substituent selected from the group consisting of a boronic acid group, a boronic acid ester group, an aldehyde group, and a pyridinium group and has a molecular weight equal to or greater than 1,000; and a polymerizable monomer.

[2] The curable composition described in [1], in which the compound has a plurality of monovalent substituents selected from the group consisting of a boronic acid group, a boronic acid ester group, an aldehyde group, and a pyridinium group.

[3] The curable composition described in [1] or [2], in which the compound is a compound having a structural unit represented by General Formula (1) which will be described later or a compound represented by General Formula (2) which will be described later.

[4] The curable composition described in [3], in which the compound having a structural unit represented by General Formula (1) further has a structural unit represented by General Formula (6) which will be described later.

[5] The curable composition described in [4], in which the compound having a structural unit represented by General Formula (1) has a structural unit represented by General Formula (6) in which $Y^{11}$ represents a fused ring group formed by the induction of a fused ring.

[6] The curable composition described in [4] or [5], in which the compound having a structural unit represented by General Formula (1) has a structural unit represented by General Formula (6) in which $Y^{11}$ is any polymerizable group selected from the group consisting of an acryloyl group, a methacryloyl group, an oxiranyl group, an oxetanyl group, and a vinyl group.

[7] The curable composition described in any one of [3] to [6], in which $L^{11}$ represents a divalent linking group represented by General Formula (8) which will be described later.

[8] The curable composition described in [7], in which each of a divalent aromatic hydrocarbon ring group and a divalent aromatic heterocyclic group represented by $T^{11}$ is monocyclic or fused polycyclic.

[9] The curable composition described in any one of [3] to [8], in which $X^{11}$ is a group represented by General Formula (3) or General Formula (4).

[10] The curable composition described in [3], in which the compound represented by General Formula (2) is a compound represented by General Formula (7) which will be described later.

[11] The curable composition described in [3] or [10], in which $L^{21}$ each independently represents a divalent linking group represented by General Formula (9) which will be described later.

[12] The curable composition described in [11], in which each of the divalent aromatic hydrocarbon ring group or the divalent aromatic heterocyclic group represented by $T^{21}$ is monocyclic or fused polycyclic.

[13] The curable composition described in any one of [10] to [12], in which $Y^{21}$ represents a polymer chain, and the polymer chain has a structural unit represented by General Formula (10) which will be described later.

[14] The curable composition described in [13], in which the polymer chain has a structural unit represented by General Formula (10) in which $Y^{31}$ represents a fused ring group formed by the induction of a fused ring.

[15] The curable composition described in [13] or [14], in which the polymer chain has a structural unit represented by General Formula (10) in which $Y^{31}$ represents any polymerizable group selected from the group consisting of an acryloyl group, a methacryloyl group, an oxiranyl group, an oxetanyl group, and a vinyl group.

[16] The curable composition described in any one of [3] and [10] to [15], in which $X^{21}$ is a group represented by General Formula (3) or General Formula (4).

[17] The curable composition described in any one of [1] to [16], in which the inorganic nitride contains at least one kind of compound selected from the group consisting of boron nitride and aluminum nitride.

[18] The curable composition described in any one of [1] to [17], in which the inorganic oxide contains at least one kind of compound selected from the group consisting of titanium oxide, aluminum oxide, and zinc oxide.

[19] The curable composition described in any one of [1] to [18], in which the polymerizable monomer has a group selected from the group consisting of an acryloyl group, a methacryloyl group, an oxiranyl group, and a vinyl group.

[20] The curable composition described in any one of [1] to [19], in which the polymerizable monomer or a cured substance of the polymerizable monomer exhibits liquid crystallinity.

[21] A thermally conductive material formed by curing the curable composition described in any one of [1] to [20].

[22] The thermally conductive material described in [21] that is in the form of a sheet.

[23] The thermally conductive material described in [21] or [22] that is used in a heat dissipation sheet.

[24] A device with a thermally conductive layer comprising: a device; and a thermally conductive layer which is disposed on the device and contains the thermally conductive material described in any one of [21] to [23].

According to the present invention, it is possible to provide a curable composition capable of providing a cured substance in which an inorganic substance exhibits excellent dispersibility and which exhibits high thermal conductivity.

Furthermore, the present invention can provide a thermally conductive material formed by curing the curable composition and a device with a thermally conductive layer comprising the thermally conductive material.

DESCRIPTION OF THE PREFERRED EMBODIMENTS

Hereinafter, the present invention will be specifically described.

In the present specification, "to" means that the numerical values listed before and after "to" are a lower limit and an upper limit respectively.

In the present specification, the description of "(meth) acryloyl group" means "either or both of an acryloyl group and a methacryloyl group".

In the present specification, an oxiranyl group is a functional group which is also referred to as an epoxy group. For example, a group, in which two adjacent carbon atoms of a saturated hydrocarbon ring group are bonded to each other through an oxo group (—O—) such that an oxirane ring is formed, and the like are also included in the oxiranyl group.

In the present specification, in a case where the description of "may have a substituent" appears, the type of the substituent, the position of the substituent, and the number of substituents are not particularly limited. The number of substituents may be, for example, 1, 2, 3, or greater. Examples of the substituent include a group of monovalent nonmetallic atoms excluding a hydrogen atom, and the substituent can be selected from the following substituent group Y, for example.

Substituent group Y: halogen atom (—F, —Br, —Cl, or —I), a hydroxy group, an alkoxy group, an aryloxy group, a thiol group, an alkylthio group, an arylthio group, an alkyldithio group, an aryldithio group, an amino group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an alkylsulfoxy group, an arylsulfoxy group, an acylthio group, an acylamino group, a N-alkylacylamino group, a N-arylacylamino group, a ureide group, a N'-alkylarylureide group, a N',N'-dialkylureide group, a N'-arylureide group, a N',N'-diarylureide group, a N'-alkyl-N-arylureide group, a N-alkylureide group, a N-arylureide group, a N'-alkyl-N-alkylureide group, a N'-alkyl-N-arylureide group, a N',N'-dialkyl-N-alkylureide group, a N',N'-dialkyl-N-arylureide group, a N'-aryl-N-alkylureide group, a N'-aryl-N-arylureide group, a N',N'-diaryl-N-alkylureide group, a N',N'-diaryl-N-arylureide group, a N'-alkyl-N'-aryl-N-alkylureide group, a N'-alkyl-N'-aryl-N-arylureide group, an alkoxycarbonylamino group, an aryloxycarbonylamino group, a N-alkyl-N-alkoxycarbonylamino group, a N-alkyl-N-aryloxycarbonylamino group, a N-aryl-N-alkoxycarbonylamino group, a N-aryl-N-aryloxycarbonylamino group, a formyl group, an acyl group, a carboxy group and a conjugated base group thereof, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, an alkylsufinyl group, an arylsulfinyl group, an alkylsulfonyl group, an arylsulfonyl group, a sulfo group ($—SO_3H$) and a conjugated base group thereof, an alkoxysulfonyl group, an aryloxysulfonyl group, a sulfinamoyl group, a N-alkylsulfinamoyl group, a N,N-dialkylsulfinamoyl group, a N-arylsulfinamoyl group, a N,N-diarylsulfinamoyl group, a N-alkyl-N-arylsulfinamoyl group, a sulfamoyl group, a N-alkylsulfamoyl group, a N,N-dialkylsulfamoyl group, a N-arylsulfamoyl group, a N,N-diarylsulfamoyl group, a N-alkyl-N-arylsulfamoyl group, a N-acylsulfamoyl group and a conjugated base group thereof, a N-alkylsulfonylsulfamoyl group ($—SO_2NHSO_2$(alkyl)) and a conjugated base group thereof, a N-arylsulfonylsulfamoyl group ($—SO_2NHSO_2$(aryl)) and a conjugated base group thereof, a N-alkylsulfonylcarbamoyl group ($—CONHSO_2$(alkyl)) and a conjugated base group thereof, a N-arylsulfonylcarbamoyl group ($—CONHSO_2$(aryl)) and a conjugated base group thereof, an alkoxysilyl group (—Si$(Oalkyl)_3$), an aryloxysilyl group (—Si$(Oaryl)_3$), a hydroxysilyl group ($—Si(OH)_3$) and a conjugated base group thereof, a phosphono group ($—PO_3H_2$) and a conjugated base group thereof, a dialkylphosphono group ($—PO_3(alkyl)_2$), a diarylphosphono group ($—PO_3(aryl)_2$), an alkylarylphosphono group ($—PO_3$(alkyl)(aryl)), a monoalkylphosphono group ($—PO_3H$(alkyl)) and a conjugated base group thereof, a monoarylphosphono group ($—PO_3H$(aryl)) and a conjugated base group thereof, a phosphonooxy group ($—OPO_3H_2$) and a conjugated base group thereof, a dialkylphosphonooxy group ($—OPO_3(alkyl)_2$), a diarylphosphonooxy group (—$OPO_3(aryl)_2$), an alkylarylphosphonooxy group (—$OPO_3$(alkyl)(aryl)), a monoalkylphosphonooxy group (—$OPO_3H$(alkyl)) and a conjugated base group thereof, a monoarylphosphonooxy group (—$OPO_3H$(aryl)) and a conjugated base group thereof, a cyano group, a nitro group, an aryl group, an alkyl group, a heterocyclic group, an alkenyl group, and an alkynyl group.

These substituents may form a ring with each other if possible or may form a ring by being bonded to the group substituted with the substituents.

[Curable Composition]

The curable composition of an embodiment of the present invention contains an inorganic substance selected from the group consisting of an inorganic nitride and an inorganic oxide, a compound which has a monovalent substituent selected from the group consisting of a boronic acid group, a boronic acid ester group, an aldehyde group, and a pyridinium group and has a molecular weight equal to or greater than 1,000, and a polymerizable monomer.

A characteristic of the curable composition according to the embodiment of the present invention is that the curable composition contains a compound (hereinafter, referred to as "specific compound" as well) which has a monovalent substituent selected from the group consisting of a boronic acid group, a boronic acid ester group, an aldehyde group, and a pyridinium group and has a molecular weight equal to or greater than 1,000.

By being adsorbed onto the surface of the aforementioned inorganic substance through a boronic acid group, a boronic acid ester group, an aldehyde group, or a pyridinium group, the specific compound makes a contribution to the improvement of the dispersibility of the inorganic substance in a cured substance. Presumably, particularly in a case where the specific compound having a molecular weight equal to or greater than 1,000 is used, the specific compound adsorbed onto the surface of the inorganic substance may function as a coating film of the inorganic substance and inhibit the aggregation of the inorganic substances. In this way, the dispersibility of the inorganic substance in the cured substance is further improved. Furthermore, presumably, particularly in a case where the specific compound contains a plurality of boronic acid groups, boronic acid ester groups, aldehyde groups, or pyridinium groups (more preferably, in a case where the specific compound is a compound having a structural unit represented by General Formula (1) or a compound represented by General Formula (2)), the adsorption of the specific compound onto the inorganic substance may occur on many spots, and hence the function of the specific compound as a coating film may be further enhanced. In this way, the dispersibility of the inorganic substance in the cured substance is further improved.

It has been revealed that the cured substance obtained from the curable composition according to the embodiment of the present invention also has excellent thermal conductivity. It is considered in the cured substance obtained from the curable composition according to the embodiment of the present invention, the inorganic substance may exhibit excellent dispersibility (that is, uneven distribution of the inorganic substance may be inhibited in the cured substance), and hence the efficiency of thermal conduction between the inorganic substances may be excellent. Presumably, as a result, the thermal conductivity of the cured substance may be further improved.

As described above, in the cured substance obtained from the curable composition according to the embodiment of the present invention, the inorganic substance exhibits excellent dispersibility. Accordingly, the content of the inorganic substance in the cured substance can be increased. As a result, the thermal conductivity of the cured substance can be further improved.

As will be described later, in a case where the specific compound has a polymerizable group (preferably any polymerizable group selected from the group consisting of a (meth)acryloyl group, an oxiranyl group, and a vinyl group), in the cured substance, the inorganic substances whose surface is modified with the specific compound (hereinafter, referred to as "surface-modified inorganic substances" as well) can more firmly adhere to each other. Accordingly, the thermal conductivity between the surface-modified inorganic substances is further improved, and consequently, the overall thermal conductivity of the cured substance is further improved.

As will be described later, it is considered that in a case where the specific compound has a fused ring structure in a molecule (in other words, in a case where the specific compound has a fused ring in a molecule), the adsorptivity between the specific compound and the inorganic substance may be further improved. Accordingly, in the cured substance, the dispersibility of the surface-modified inorganic substances is further improved, and the adhesiveness between the surface-modified inorganic substances is further improved. As a result, the thermal conductivity between the surface-modified inorganic substances is further improved, and the overall thermal conductivity of the cured substance is further improved.

As will be described later, in a case where the specific compound has a group represented by General Formula (8) or General Formula (9), a function of aligning polymerizable monomers is imparted to the surface-modified inorganic substances, and the thermal conductivity of the cured substance is further improved. Particularly, in a case where the polymerizable monomers or a cured substance thereof exhibits liquid crystallinity, the thermal conductivity of the cured substance is further improved. That is, in a case where the polymerizable monomers or a cured substance thereof exhibits liquid crystallinity, the polymerizable monomers or a cured substance thereof are aligned (vertical alignment) on the surface of the surface-modified inorganic substances, and the aligned liquid crystal components are interposed between the surface-modified inorganic substances. Accordingly, the thermal conductivity between the surface-modified inorganic substances is further improved, and as a result, the overall thermal conductivity of the cured substance is further improved.

<Inorganic Substance>

The curable composition contains an inorganic substance selected from the group consisting of an inorganic nitride and an inorganic oxide.

The shape of the inorganic substance is not particularly limited, and the inorganic substance may have a granule shape, a film shape, or a plate shape. In a case where the inorganic substance has a granule shape, for example, the inorganic substance may have a rice grain shape, a spherical shape, a cubical shape, a spindle shape, a scale shape, an aggregated shape, or an amorphous shape.

The size of the inorganic substance is not particularly limited. However, in view of further improving the dispersibility of the inorganic substance in the cured substance, an average particle diameter of the inorganic substance is preferably equal to or smaller than 500 μm, more preferably equal to or smaller than 200 μm, and even more preferably equal to or smaller than 100 μm. The lower limit of the size is not particularly limited. However, in view of handleability, the lower limit is preferably equal to or greater than 10 nm, and more preferably equal to or greater than 100 nm.

As a method for measuring the average particle diameter, 100 inorganic substances are randomly selected using an electron microscope, particle diameters (major axes) of the inorganic substances are measured, and the arithmetic mean thereof is calculated. In a case where a commercial product is used, the value listed in the catalog may be used.

In view of further improving the thermal conductivity of the cured substance, it is preferable to use inorganic substances having different average particle diameters in combination.

The inorganic nitride is not particularly limited. Examples thereof include boron nitride (BN), carbon nitride ($C_3N_4$), silicon nitride ($Si_3N_4$), gallium nitride (GaN), indium nitride (InN), aluminum nitride (AlN), chromium nitride ($Cr_2N$), copper nitride (Cu3N), iron nitride ($Fe_4N$ or $Fe_3N$), lanthanum nitride (LaN), lithium nitride ($Li_3N$), magnesium nitride ($Mg_3N_2$), molybdenum nitride ($Mo_2N$), niobium nitride (NbN), tantalum nitride (TaN), titanium nitride (TiN), tungsten nitride ($W_2N$, $WN_2$, or WN), yttrium nitride (YN), zirconium nitride (ZrN), and the like.

One kind of inorganic nitride may be used singly, or a plurality of inorganic nitrides may be used in combination.

In view of further improving the thermal conductivity, it is preferable that the inorganic nitride contains at least one kind of atom selected from the group consisting of a boron atom, an aluminum atom, and a silicon atom. More specifically, the inorganic nitride is more preferably at least one kind of nitride selected from the group consisting of aluminum nitride, boron nitride, and silicon nitride, and even more preferably boron nitride or aluminum nitride.

The inorganic oxide is not particularly limited. Examples thereof include zirconium oxide ($ZrO_2$), titanium oxide ($TiO_2$), silicon oxide ($SiO_2$), aluminum oxide ($Al_2O_3$), iron oxide ($Fe_2O_3$, FeO, or $Fe_3O_4$), copper oxide (CuO or $Cu_2O$), zinc oxide (ZnO), yttrium oxide ($Y_2O_3$), niobium oxide ($Nb_2O_5$), molybdenum oxide ($MoO_3$), indium oxide ($In_2O_3$ or $In_2O$), tin oxide ($SnO_2$), tantalum oxide ($Ta_2O_5$), tungsten oxide ($WO_3$ or $W_2O_5$), lead oxide (PbO or $PbO_2$), bismuth oxide ($Bi_2O_3$), cerium oxide ($CeO_2$ or $Ce_2O_3$), antimony oxide ($Sb_2O_3$ or $Sb_2O_5$), germanium oxide ($GeO_2$ or GeO), lanthanum oxide ($La_2O_3$), ruthenium oxide ($RuO_2$), and the like.

One kind of inorganic oxide may be used singly, or a plurality of inorganic oxides may be used in combination.

In view of further improving the thermal conductivity, the inorganic oxide preferably contains at least one kind of oxide selected from the group consisting of titanium oxide, aluminum oxide, and zinc oxide.

The inorganic oxide may be an oxide generated in a case where a metal prepared as a non-oxide is oxidized due to the environment or the like.

As a content of the inorganic substance in the curable composition, an optimal content is appropriately selected according to the use of the curable composition. Particularly, in view of further improving the thermal conductivity at the time of using the cured substance in a heat dissipation sheet, the content of the inorganic substance with respect to the total solid content in the curable composition is preferably 10% to 90% by mass, more preferably 30% to 85% by mass, even more preferably 40% to 85% by mass, particularly preferably 55% to 75% by mass, and most preferably 65% to 75% by mass.

The curable composition may contain one kind of inorganic substance or two or more kinds of inorganic substances.

<Specific Compound>

The curable composition contains a compound (specific compound) which has a monovalent substituent selected from the group consisting of a boronic acid group, a boronic acid ester group, an aldehyde group, and a pyridinium group and has a molecular weight equal to or greater than 1,000.

The molecular weight of the specific compound is equal to or greater than 1,000. In view of further improving the dispersibility of the inorganic substance in the cured substance, the molecular weight of the specific compound is preferably equal to or greater than 2,000, more preferably equal to or greater than 3,000, even more preferably equal to or greater than 4,000, and particularly preferably equal to or greater than 10,000. From the viewpoint of solubility, the molecular weight of the specific compound is preferably equal to or smaller than 200,000, more preferably equal to or smaller than 100,000, and even more preferably equal to or smaller than 50,000.

In a case where the specific compound has a molecular weight distribution, the molecular weight of the compound means a weight-average molecular weight.

In the present invention, the weight-average molecular weight of the specific compound is measured by a Gel Permeation Chromatography (GPC) method and expressed in terms of standard polystyrene.

Specifically, in GPC, for example, EcoSEC HLC-8320GPC (manufactured by Tosoh Corporation) is used. As columns, for example, three TSKgel SuperAWM-H (manufactured by Tosoh Corporation) columns are used, and as an eluent, for example, N-methylpyrrolidone (NMP) is used.

The specific compound has a monovalent substituent (hereinafter, referred to as "specific substituent" as well) selected from the group consisting of a boronic acid group, a boronic acid ester group, an aldehyde group, and a pyridinium group. The specific compound may have one or more kinds of specific substituents. In view of further improving the dispersibility of the inorganic substance in the cured substance, it is preferable that the specific compound has a plurality of specific substituents.

Specifically, as the specific substituent, groups represented by General Formulae (3) to (5) are preferable.

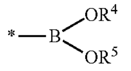

(3)

$*-CHO$ (4)

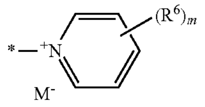

(5)

In General Formula (3), $R^4$ and $R^5$ each independently represent a hydrogen atom or a substituent selected from the group consisting of an aliphatic hydrocarbon group, an aromatic hydrocarbon ring group, and an aromatic heterocyclic group.

The aliphatic hydrocarbon group may be any of a linear, branched, or cyclic aliphatic hydrocarbon group. The number of carbon atoms in the aliphatic hydrocarbon group is not particularly limited, but is preferably 1 to 30 and more preferably 2 to 10. Specific examples of the aliphatic hydrocarbon group include an alkyl group, an alkenyl group, an alkynyl group, and the like.

The aromatic hydrocarbon ring group may be any of a monocyclic or polycyclic structure. The number of carbon atoms in the aromatic hydrocarbon ring group is not particularly limited, but is preferably 5 to 18 and more preferably 5 to 10. Specific examples of the aromatic hydrocarbon ring group include an aryl group (a phenyl group, a tolyl group, a xylyl group, or the like), a naphthyl group, an anthryl group, a phenanthryl group, an indenyl group, an acenaphthenyl group, a fluorenyl group, a pyrenyl group, and the like.

The aromatic heterocyclic group may be any of a monocyclic or polycyclic structure. Examples of heteroatoms that the aromatic heterocyclic group contain include a nitrogen atom, an oxygen atom, and a sulfur atom. The number of carbon atoms in the aromatic heterocyclic group is not particularly limited, but is preferably 5 to 18. Specific examples of rings constituting the aromatic heterocyclic group include a pyridine ring, a pyridazine ring, a pyrimidine ring, a pyrazine ring, a triazine ring, a thiophene ring, a thiazole ring, and an imidazole ring.

In a case where $R^4$ and $R^5$ represent a substituent, $R^4$ and $R^5$ may form a ring by being bonded to each other.

Furthermore, $R^4$ and $R^5$ may have a substituent. The type of the substituent is not particularly limited, and examples thereof include the groups listed in the substituent group Y described above.

In General Formula (3), $R^4$ and $R^5$ particularly preferably represent a hydrogen atom.

In General Formula (5), $R^6$ represents a substituent. The type of the substituent is not particularly limited, and examples thereof include the groups listed in the substituent group Y described above. In a case where there is a plurality of $R^6$'s, $R^6$'s adjacent to each other may form a ring by being bonded to each other. $R^6$ is particularly preferably an unsubstituted amino group or a substituted amino group. As the substituted amino group, a substituted amino group having 1 to 20 carbon atoms is preferable. As the substituted amino group, a dialkyl-substituted amino group is preferable.

In a case where $R^6$ represents a dialkyl-substituted amino group, two alkyl groups may be bonded to each other so as to form a nitrogen-containing heterocyclic ring. The nitrogen-containing heterocyclic ring formed at this time is preferably a 5-membered or 6-membered ring.

$R^6$ more preferably represents an unsubstituted amino group or a dialkyl-substituted amino group having 1 to 12 carbon atoms, and even more preferably represents an unsubstituted amino group or a dialkyl-substituted amino group having 1 to 8 carbon atoms.

In a case where $R^6$ represents an unsubstituted amino group and a substituted amino group, it is preferable that position 4 of a pyridinium ring is substituted.

m represents an integer of 0 to 5. m is preferably 0 to 3, and more preferably 1.

$M^-$ represents a counter anion. The type of the counter anion is not particularly limited, and examples thereof include a halogen cation and the like.

In General Formulae (3) to (5), * represents a binding position.

In view of further improving the dispersibility of the inorganic substance in the cured substance, the specific compound is preferably a compound having a structural unit represented by General Formula (1) or a compound represented by General Formula (2).

Hereinafter, first, the compound having a structural unit represented by General Formula (1) will be specifically described.

(Compound Having Structural Unit Represented by General Formula (1))

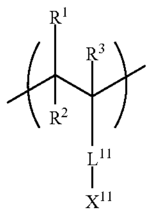
(1)

In General Formula (1), $R^1$, $R^2$, and $R^3$ each independently represent a hydrogen atom or a substituent. $X^{11}$ represents any group selected from General Formula (3), (4), or (5) described above. Each of General Formulae (3) to (5) is bonded to $L^{11}$ in the position represented by *. $L^{11}$ represents a single bond or a divalent linking group.

$R^1$, $R^2$, and $R^3$ each independently represent a hydrogen atom or a substituent. The type of the substituent is not particularly limited, and examples thereof include the groups listed in the substituent group Y described above.

Particularly, $R^1$, $R^2$, and $R^3$ preferably each represent a hydrogen atom or an alkyl group (preferably having 1 to 5 carbon atoms), and more preferably each represent a hydrogen atom.

$X^{11}$ represents any group selected from General Formula (3), (4), or (5) described above. Particularly, $X^{11}$ preferably represents a group represented by General Formula (3) or General Formula (4), and more preferably represents a group represented by General Formula (3).

$L^{11}$ represent a single bond or a divalent linking group. The divalent linking group is not particularly limited, and examples thereof include —O—, —S—, —CO—, —CH═N—, —N═CH—, —N═N—, —NR— (R represents a hydrogen atom or an alkyl group), a divalent hydrocarbon group (for example, an alkylene group, an alkenylene group (example: —CH═CH—), an alkynylene group (example: —C≡C—), and an arylene group), and a group obtained by combining these. Particularly, in view of further improving the thermal conductivity of the cured substance, $L^{11}$ preferably represents a divalent linking group represented by General Formula (8).

$$*_1—L^{13}—(T^{11}—Z^{11})_p—*_2 \quad (8)$$

In General Formula (8), $L^{13}$ represents a single bond or a divalent linking group. $T^{11}$ each independently represents a divalent aromatic hydrocarbon ring group or a divalent aromatic heterocyclic group. $Z^{11}$ each independently represents a single bond or a divalent linking group. p represents an integer of 1 to 5. In a case where p is equal to or greater than 2, a plurality of $T^{11}$'s and $Z^{11}$'s may be the same as or different from each other respectively. *1 represents a position bonded to the main chain of the compound having a structural unit represented by General Formula (1). *2 represents a position bonded to $X^{11}$.

$L^{13}$ is preferably a single bond, —O—, —O—CO—, —CO—O—, —C≡C—, —CH═CH—, —CH═N—, —N═CH—, —N═N—, —O-AL-O—, —O-AL-O—CO—, —O-AL-CO—O—, —CO—O-AL-O—, —CO—O-AL-O—CO—, —CO—O-AL-CO—O—, —O—CO-AL-O—, —O—CO-AL-O—CO—, or —O—CO-AL-CO—O—. AL is an alkylene group having 1 to 10 carbon atoms. $L^{13}$ is more preferably a single bond, —O—, —O-AL-O—, —O-AL-O—CO—, —O-AL-CO—O—, —CO—O-AL-O—, —CO—O-AL-O—CO—, —CO—O-AL-CO—O—, —O—CO-AL-O—, —O—CO-AL-O—CO—, or —O—CO-AL-CO—O—.

$T^{11}$ represents a divalent aromatic hydrocarbon ring group or a divalent aromatic heterocyclic group. In view of further improving the dispersibility of the inorganic substance in the cured substance and/or in view of further improving the thermal conductivity of the cured substance, $T^{11}$ particularly preferably represents a divalent linking group having a 5-membered or 6-membered ring. The number of aromatic rings contained in each of the divalent aromatic hydrocarbon ring group and the divalent aromatic heterocyclic group is not particularly limited. Each of the divalent aromatic hydrocarbon ring group and the divalent aromatic heterocyclic group may be a monocyclic ring or a fused ring having two or more aromatic rings. That is, each of the divalent aromatic hydrocarbon ring group and the divalent aromatic heterocyclic group may be a monocyclic ring (constituted with a single ring) or a fused polycyclic ring (constituted with two or more aromatic rings fused with each other). Particularly, in view of further improving the dispersibility of the inorganic substance in the cured substance and/or in view of further improving the thermal conductivity of the cured substance, each of the divalent aromatic hydrocarbon ring group and the divalent aromatic heterocyclic group is preferably fused polycyclic ring.

That is, specifically, $T^{11}$ is preferably a divalent monocyclic aromatic hydrocarbon ring group, a divalent monocyclic aromatic heterocyclic group, or a fused ring group induced from a fused ring formed by the fusion of two or more members selected from the group consisting of a monocyclic aromatic hydrocarbon ring and a monocyclic aromatic heterocyclic ring. The fused ring group mentioned herein means a group formed by removing two hydrogen atoms from the aforementioned fused ring.

Examples of the monocyclic aromatic hydrocarbon ring include a benzene ring. Examples of the 6-membered monocyclic aromatic heterocyclic ring include a pyridine ring, a pyridazine ring, a pyrimidine ring, a pyrazine ring, and a triazine ring. Examples of the 5-membered monocyclic aromatic heterocyclic ring include a thiophene ring, a thiazole ring, and an imidazole ring.

Examples of the fused ring include a fused ring formed by the fusion of two or more 6-membered monocyclic aromatic hydrocarbon rings, a fused ring formed by the fusion of two or more 5-membered or 6-membered monocyclic aromatic heterocyclic rings, a fused ring formed by the fusion of one or more 6-membered monocyclic aromatic hydrocarbon rings and one or more 5-membered or 6-membered monocyclic aromatic heterocyclic rings, and the like. Specifically, examples of the fused ring include a pyrene ring, a triphenylene ring, a perylene ring, and the like.

$T^{11}$ may further have a substituent. The type of the substituent is not particularly limited, and examples thereof include the groups listed in the substituent group Y described above. More specifically, examples of the substituent include a halogen atom, a cyano group, an alkyl group having 1 to 12 carbon atoms, and an alkoxy group having 1 to 12 carbon atoms. The alkyl group and the alkoxy group may be substituted with an acyl group having 2 to 12 carbon atoms or an acyloxy group having 2 to 12 carbon atoms. As the substituent, an alkyl group having 1 to 12 carbon atoms (preferably having 1 to 6 carbon atoms and more preferably having 1 to 3 carbon atoms) is preferable. $T^{11}$ may have two or more substituents. For example, in a case where $T^{11}$ is a phenylene group, the phenylene group may be substituted with 1 to 4 alkyl groups each having 1 to 12 carbon atoms (preferably having 1 to 6 carbon atoms and more preferably having 1 to 3 carbon atoms).

$T^{11}$ is preferably a substituted or unsubstituted phenylene group or a substituted or unsubstituted divalent fused ring group induced from a fused ring formed by the fusion of two or more 6-membered monocyclic aromatic hydrocarbon rings, and more preferably a substituted or unsubstituted phenylene group or a substituted or unsubstituted fused ring group induced from a pyrene ring, a triphenylene ring, or a perylene ring.

The binding position of $Z^{11}$ on $T^{11}$ is not particularly limited. The same is true for a case where $X^{11}$ is directly bonded to $T^{11}$ (in a case where $Z^{11}$ is a single bond). For example, in a case where $T^{11}$ is a fused ring group formed by the induction of a pyrene ring, by removing any of the hydrogen atoms on the fused ring, $T^{11}$ is bonded to $X^{11}$.

$Z^{11}$ is preferably a single bond, —O—, —O—CO—, —CO—O—, —C≡C—, —$CH_2$—, —CH═CH—, —CH═N—, —N═CH—, —N═N—, or a group obtained by combining these, and more preferably a single bond, —O—, —O—CO—, —CO—O—, —$CH_2$—O—, —O—$CH_2$—, —$CH_2$—$CH_2$—O—, or —O—$CH_2$—$CH_2$—.

p represents an integer of 1 to 5. Particularly, in view of further improving the dispersibility of the inorganic substance in the cured substance, p is preferably 1 to 3.

In a case where p is equal to or greater than 2, a plurality of $T^{11}$'s and $Z^{11}$'s may be the same as or different from each other respectively. *1 represents a position bonded to the main chain of the compound having a structural unit represented by General Formula (1). *2 represents a position bonded to $X^{11}$.

Specific examples of the structural unit represented by General Formula (1) will be shown below, but the present invention is not limited thereto. Among the structural units exemplified below, for the structural unit having a —CHO group on a fused ring group formed by the induction of a pyrene ring, the position of —CHO group is not limited to the position exemplified below. That is, the —CHO group may substitute the structural unit at the position of any of the hydrogen atoms on the fused ring group formed by the induction of a pyrene ring. That is, the structural unit may be a position isomer of the structural units exemplified below.

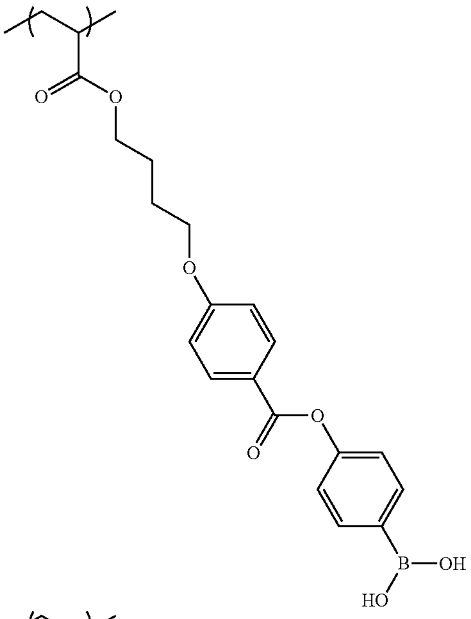

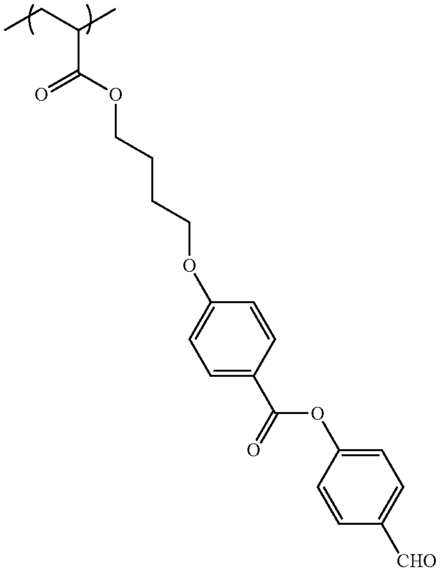

-continued

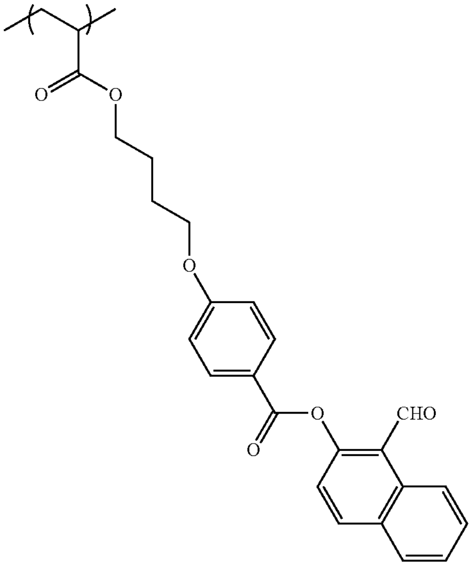

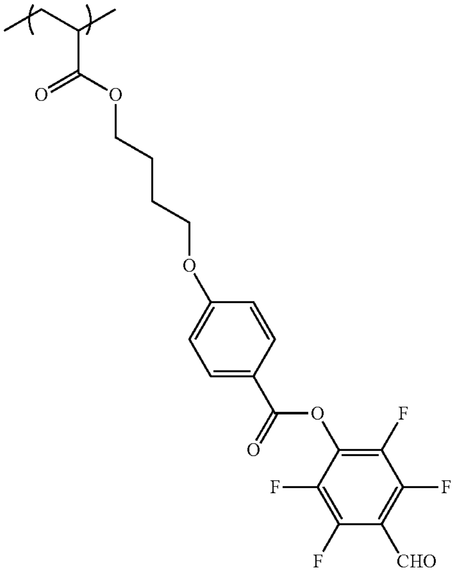

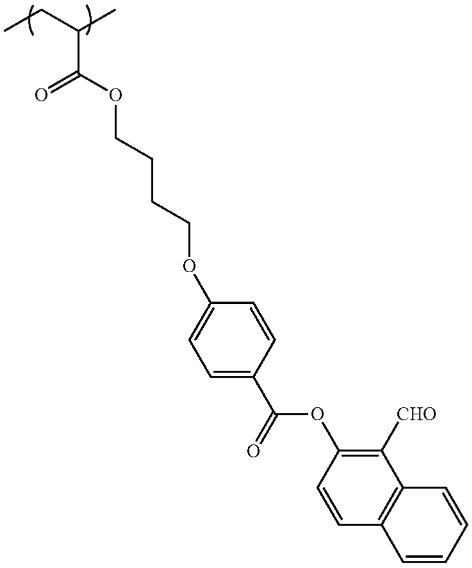

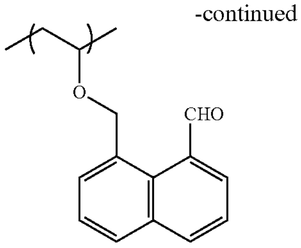
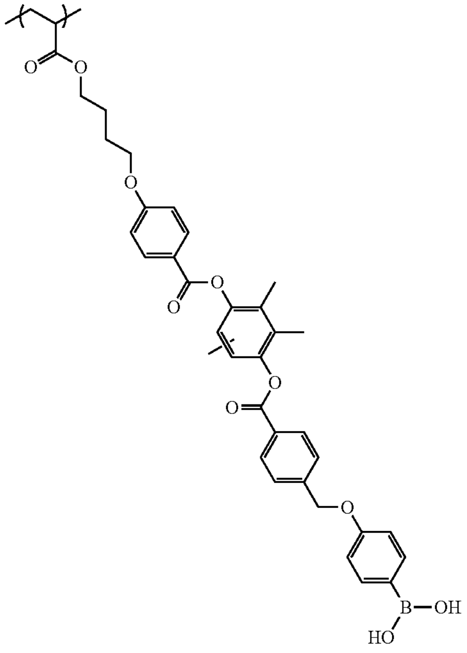
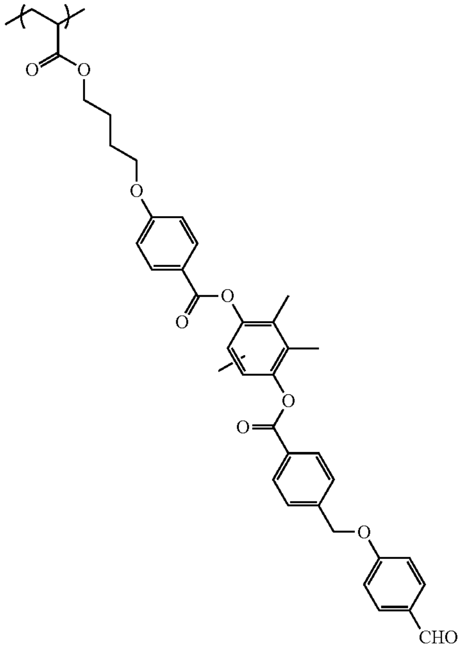
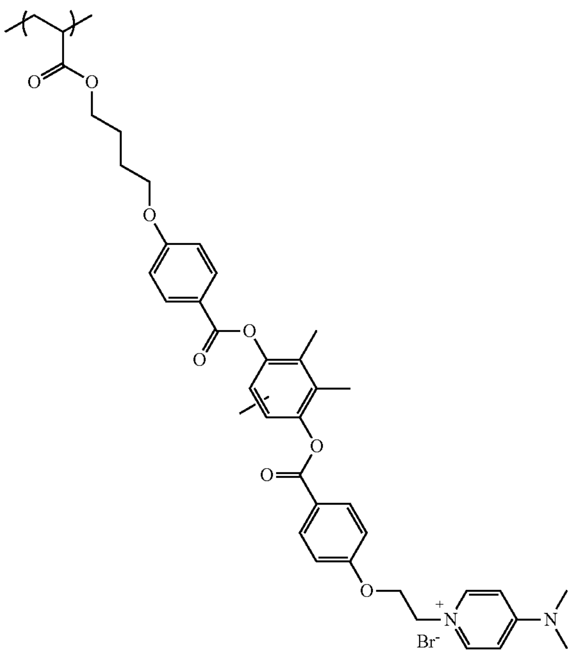
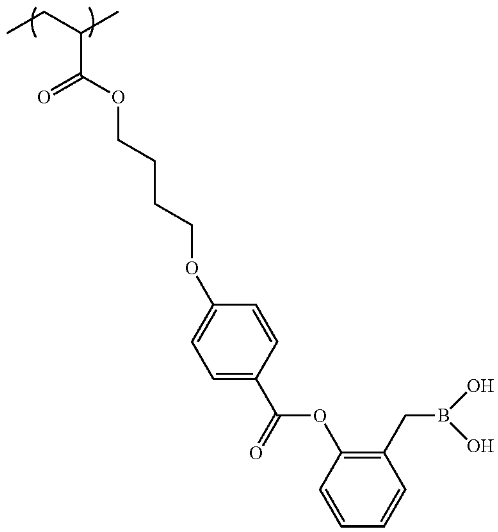

-continued

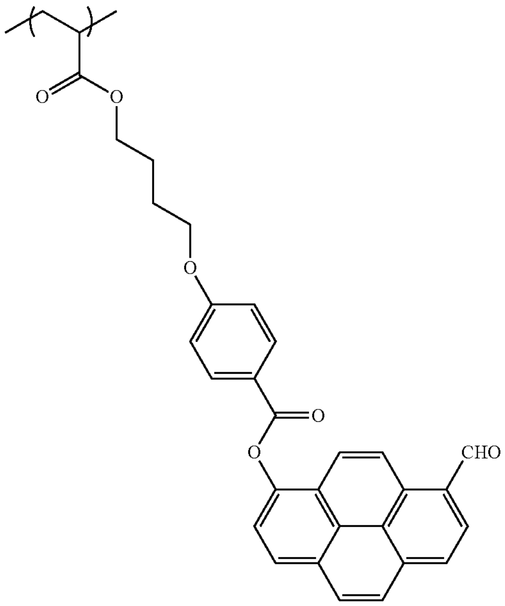

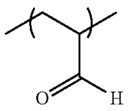

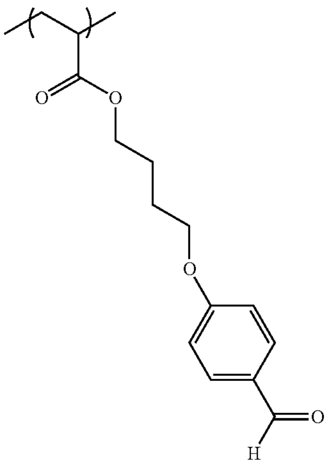

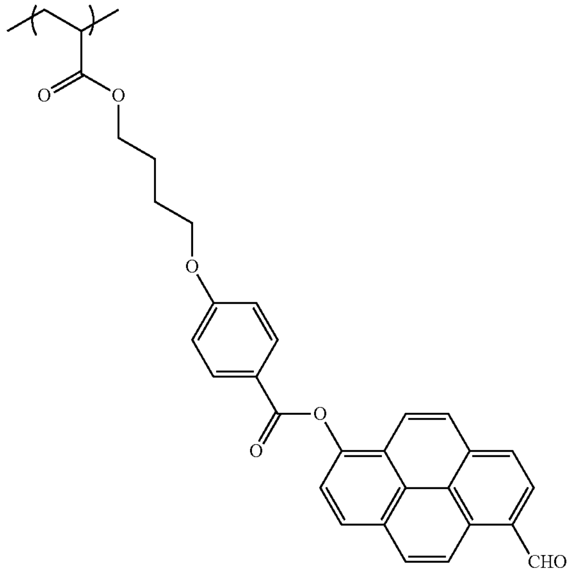

-continued

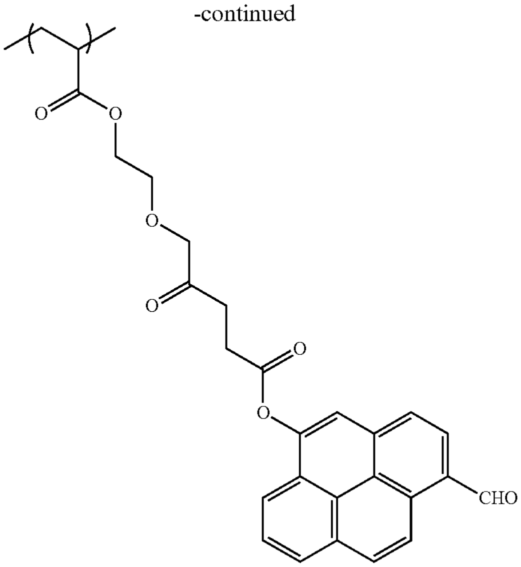

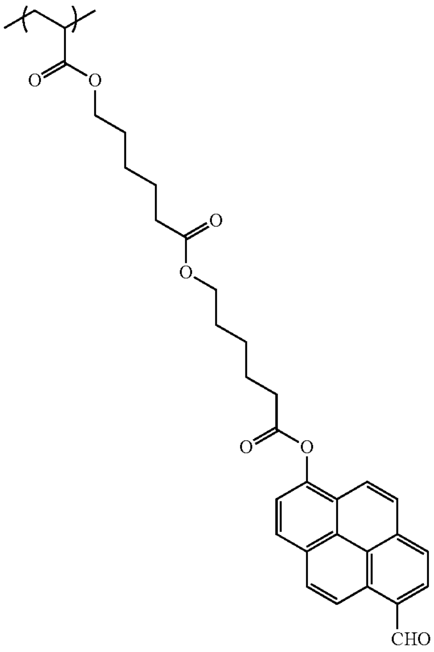

In view of further improving the dispersibility of the inorganic substance, it is preferable that the compound having a structural unit represented by General Formula (1) further has a structural unit represented by General Formula (6).

(6)

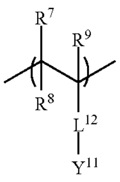

In General Formula (6), $R^7$, $R^8$, and $R^9$ each independently represent a hydrogen atom or a substituent. $L^{12}$ represents a single bond or a divalent linking group. $Y^{11}$ represents a substituent.

$R^7$, $R^8$, and $R^9$ have the same definition as $R^1$, $R^2$, and $R^3$ described above respectively, and preferred aspects thereof are also the same.

$L^{12}$ represents a single bond or a divalent linking group. The divalent linking group is not particularly limited, and examples thereof include —O—, —S—, —CO—, —CH═CH—, —CH═N—, —N═CH—, —N═N—, —NR— (R represents a hydrogen atom or an alkyl group), a divalent hydrocarbon group (for example, an alkylene group, an alkenylene group (example: —CH═CH—), an alkynylene group (example: —C≡C—), and an arylene group), or a group obtained by combining these.

$L^{12}$ is preferably a single bond, —O—, —O—CO—, —CO—O—, —C≡C—, —CH═CH—, —CH═N—, —N═CH—, —N═N—, —O-AL-O—, —CO—O-AL, —O—CO-AL-, —O-AL-O—CO—, or —CO—O-AL-O—. AL represents an alkylene group having 1 to 10 carbon atoms. AL may have a substituent (for example, a hydroxyl group).

$Y^{11}$ represents a substituent. The type of the substituent is not particularly limited, and examples thereof include the groups listed in the substituent group Y described above. Among these, a crosslinking group (preferably a polymerizable group) or a fused ring group formed by the induction of a fused ring is preferable. The compound having a structural unit represented by General Formula (1) may contain both the structural unit represented by General Formula (6) in which $Y^{11}$ represents a crosslinking group (preferably a polymerizable group) and the structural unit represented by General Formula (6) in which $Y^{11}$ represents a fused ring group formed by the induction of a fused ring.

In a case where the substituent is a crosslinking group (preferably a polymerizable group), the thermal conductivity of the inorganic substance is further improved. The crosslinking group is a group for crosslinking the compounds having a structural unit represented by General Formula (1).

The type of the polymerizable group is not particularly limited, and examples thereof include known polymerizable groups. In view of reactivity, a functional group which can cause an addition polymerization reaction is preferable, and a polymerizable ethylenically unsaturated group or a cyclic polymerizable group is more preferable. Examples of the polymerizable group include an acryloyl group, a methacryloyl group, an oxiranyl group, a vinyl group, a maleimide group, a styryl group, an allyl group, an oxetanyl group, and the like. A hydrogen atom in each of these groups may be substituted with another substituent such as a halogen atom. Among the polymerizable groups, an acryloyl group, a methacryloyl group, an oxiranyl group, an oxetanyl group, or a vinyl group is preferable.

In a case where $Y^{11}$ is a fused ring group formed by the induction of a fused ring, the adsorptivity between the specific compound and the inorganic substance (particularly the inorganic nitride) is improved, and the dispersibility of the inorganic substance in the cured substance is further improved.

The fused ring group formed by the induction of a fused ring is a group formed by removing one hydrogen atom from the fused ring. The type of the fused ring is not particularly limited. Examples of the fused ring include a fused ring formed by the fusion of two or more rings selected from the group consisting of an aromatic hydrocarbon ring and an aromatic heterocyclic ring. Particularly, in view of adsorptivity, a fused ring formed by fusing of two or more 6-membered aromatic hydrocarbon rings is preferable, and a pyrene ring, a triphenylene ring, a perylene ring, a naphthopyrene ring, or perylene tetracarboxylic acid diimide is more preferable.

Specific examples of the structural unit represented by General Formula (6) will be shown below, but the present invention is not limited thereto.

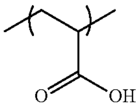

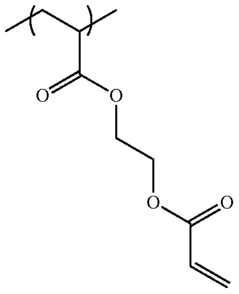

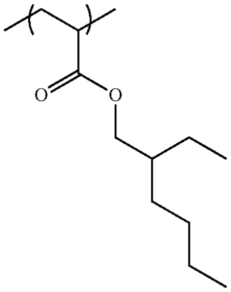

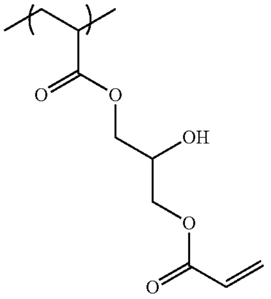

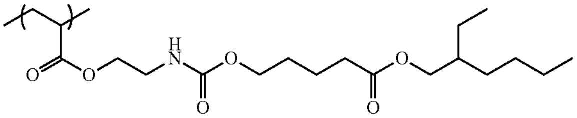

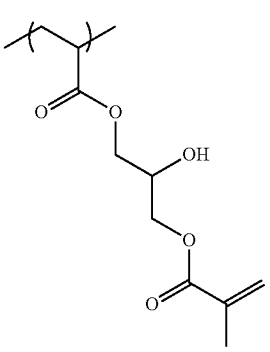

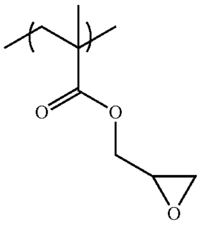

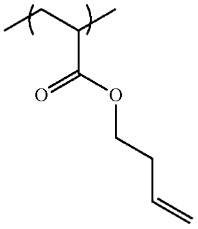

-continued

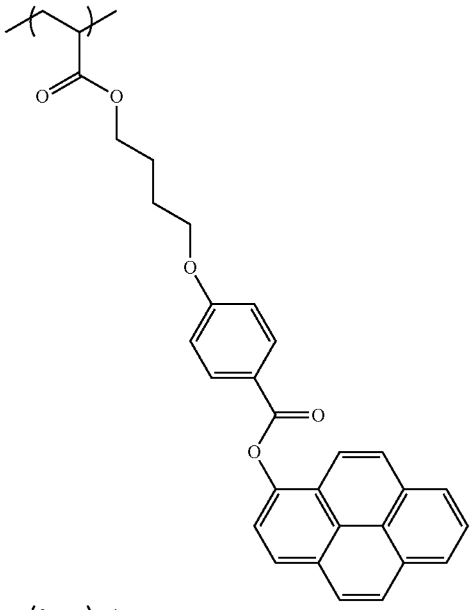

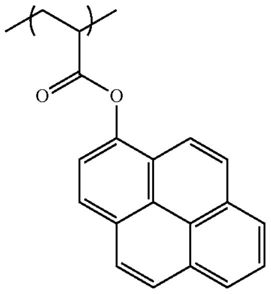

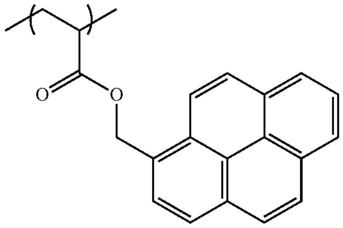

In the compound having a structural unit represented by General Formula (1), the content of the structural unit represented by General Formula (1) with respect to all the structural units is 5 to 100 mol % for example, preferably 10 to 70 mol %, and more preferably 10 to 50 mol %.

In a case where the compound having a structural unit represented by General Formula (1) has a structural unit represented by General Formula (6), the content of the structural unit represented by General Formula (6) with respect to all the structural units is 5 to 90 mol % for example, preferably 15 to 90 mol %, and more preferably 20 to 80 mol %.

The compound having a structural unit represented by General Formula (1) may contain one or more kinds of structural units represented by General Formula (1) or two or more kinds of structural units represented by General Formula (1). The compound may further have one or more kinds of structural units represented by General Formula (6) or two or more kinds of structural units represented by General Formula (6).

The compound having a structural unit represented by General Formula (1) can be synthesized based on known methods.

Specific examples of the compound having a structural unit represented by General Formula (1) will be shown below, but the present invention is not limited thereto.

In the following specific examples, h, h1, h2, h11, h21, and h22 each represent the content of the structural unit expressed as mol %. h equals 100 mol %, h1+h2 equals 100 mol %, and h11+h21+h22 equals 100 mol %.

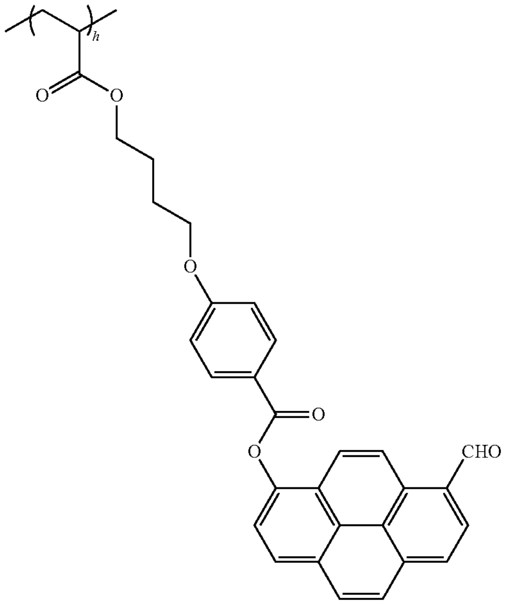

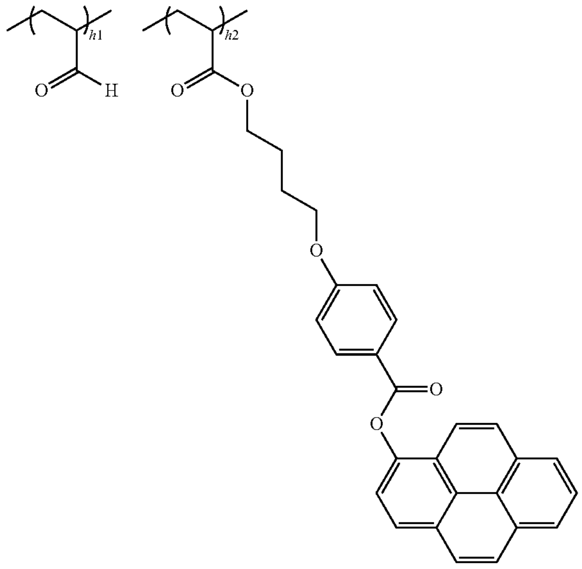

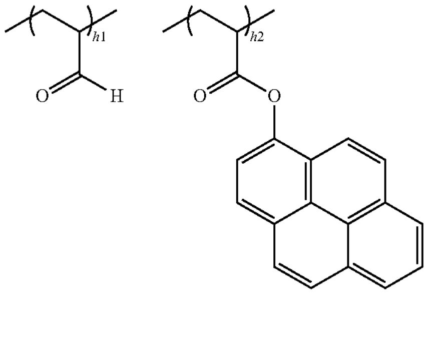

-continued
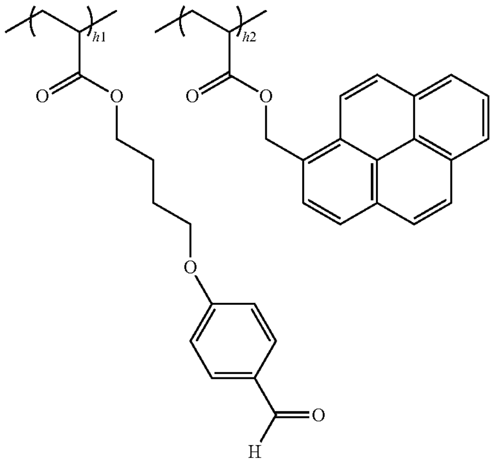
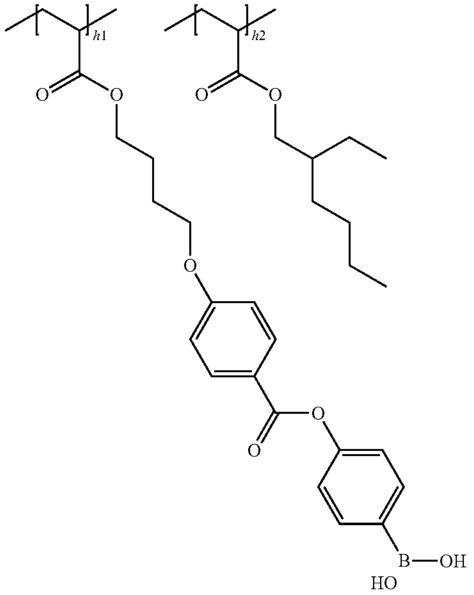
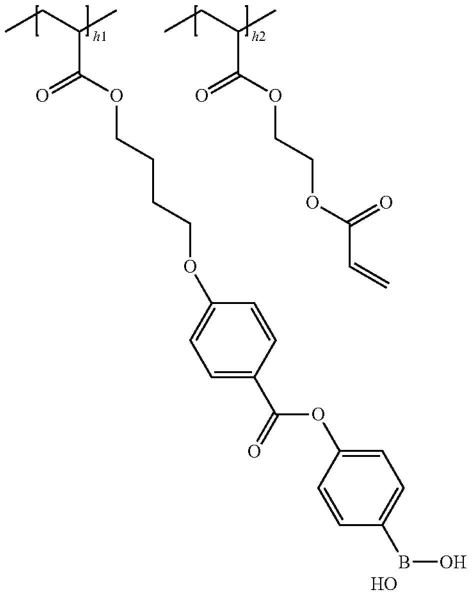
-continued
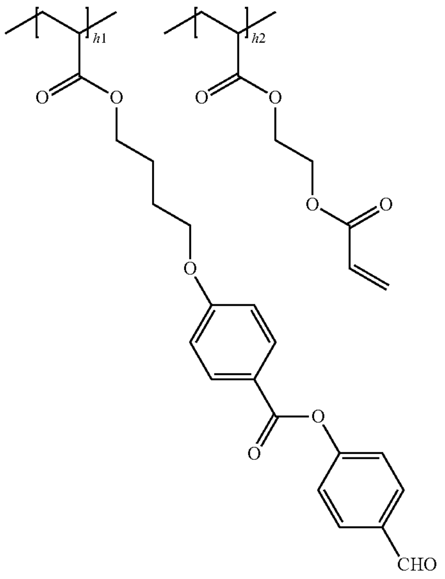
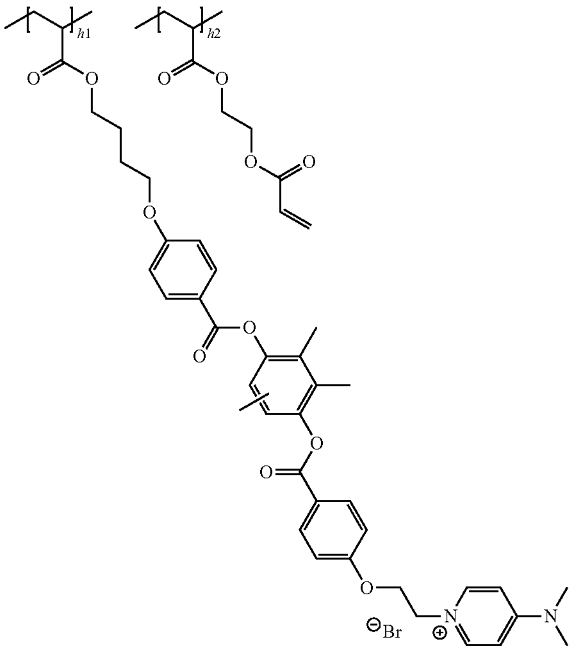
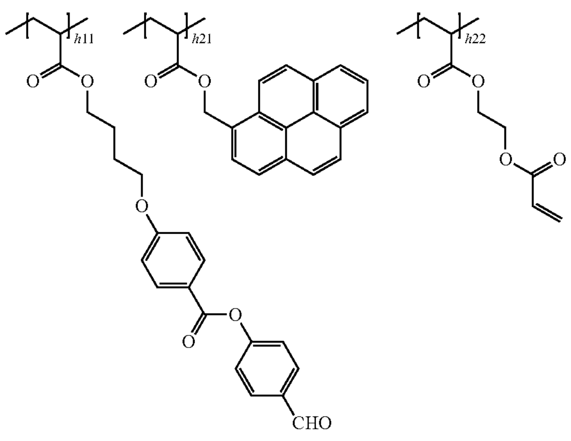

-continued

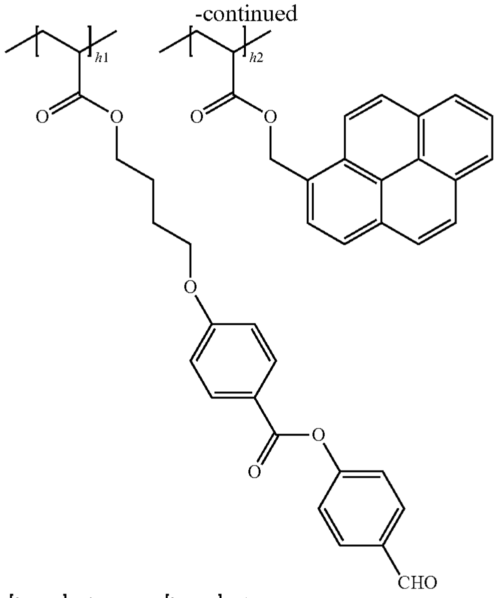

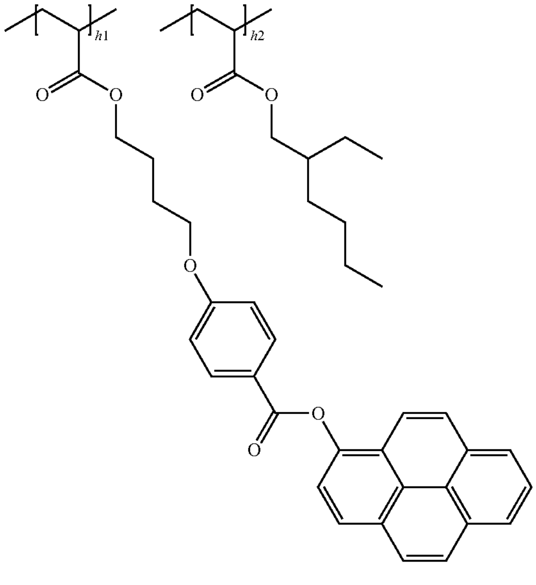

Next, the compound represented by General Formula (2) will be specifically described. (Compound having structural unit represented by general formula (2))

$$A^{21}\text{—}(L^{21}\text{—}X^{21})_l \qquad (2)$$

In General Formula (2), $X^{21}$ represents any group selected from General Formula (3), (4), or (5) described above. Each of General Formulae (3) to (5) is bonded to $L^{21}$ at the position represented by *. $A^{21}$ represents an l-valent substituent. l represents an integer equal to or greater than 2. $L^{21}$ represents a single bond or a divalent linking group.

$A^{21}$ represents an l-valent group (l represents an integer equal to or greater than 2). $A^{21}$ is preferably, for example, a carbon atom, a silicon atom, a sulfur atom, an oxygen atom, a nitrogen atom, a group formed of carbon atom-oxygen atom-carbon atom, a group formed of carbon atom-oxygen atom-carbon atom-oxygen atom-carbon atom, an l-valent aliphatic hydrocarbon ring, an l-valent aromatic hydrocarbon ring, or an l-valent heterocyclic ring. "Group formed of carbon atom-oxygen atom-carbon atom" means a group represented by General Formula (Y13), which will be described later, in which W represents 1 and La represents an oxygen atom, and "group formed of carbon atom-oxygen atom-carbon atom-oxygen atom-carbon atom" means a group represented by General Formula (Y13), which will be described later, in which W represents 2 and La represents an oxygen atom.

The number of carbon atoms contained in the aliphatic hydrocarbon ring is preferably 3 to 15, more preferably 3 to 10, and even more preferably 5 to 10.

The number of carbon atoms contained in the aromatic hydrocarbon ring is preferably 6 to 18, more preferably 6 to 14, and even more preferably 6 to 10.

The heterocyclic ring is preferably a 5- to 7-membered ring having at least one N atom, one O atom, one S atom, or one Se atom in the ring structure, and more preferably a 5- to 6-membered ring.

Examples of $A^{21}$ include groups represented by General Formulae (Y1) to (Y15). In each of the general formulae, * represents a position bonded to the divalent linking group represented by $L^{21}$.

In a case where $A^{21}$ represents "carbon atom", $A^{21}$ is a group represented by General Formula (Y6). In a case where $A^{21}$ represents "silicon atom", $A^{21}$ is a group represented by General Formula (Y10). In a case where $A^{21}$ represents "sulfur atom, $A^{21}$ is a group represented by General Formula (Y8). In a case where $A^{21}$ represents "oxygen atom", $A^{21}$ is a group represented by General Formula (Y9). In a case where $A^{21}$ represents "nitrogen atom", $A^{21}$ is a group represented by General Formula (Y11).

The aforementioned "l-valent aliphatic hydrocarbon ring" is, for example, a group represented by General Formula (Y12) or the like. "l-valent aromatic hydrocarbon ring" is, for example, a group represented by General Formula (Y7) or the like. "l-valent heterocyclic ring" is, for example, a group represented by General Formulae (Y3) to (Y5) or the like.

In the group represented by General Formula (Y13), $C^L$ represents a carbon atom or a silicon atom, and W represents 1 to 4. $L_a$ is not particularly limited as long as it is a divalent linking group. Examples of the divalent linking group include —O—, —S—, —$NR^a$—, —CO—, an alkylene group (which may be any of a cyclic, branched, or linear alkylene group), an alkenylene group, an alkynylene group, an arylene group, a heteroarylene group, or a divalent group obtained by combining these. Examples of $R^a$ include a hydrogen atom, an alkyl group (preferably a linear or branched alkyl group having 1 to 10 carbon atoms), a halogen atom (preferably a fluorine atom, a chlorine atom, a bromine atom, or an iodine atom), and an aryl group (preferably an aryl group having 6 to 20 carbon atoms).

In the group represented by General Formula (Y14) or (Y15), $C^L$ represents a carbon atom or a silicon atom, and $R^a$ represents a substituent (for example, an alkyl group a group having a polymer chain, or the like). A plurality of $R^a$'s in General Formula (Y15) may be the same as or different from each other.

* —S—S— * (Y1)

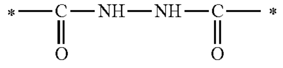

(Y2)

-continued (Y3)

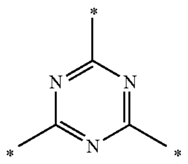

(Y4)

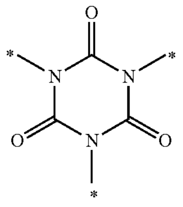

(Y5)

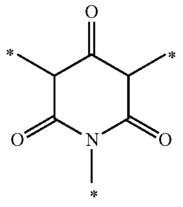

(Y6)

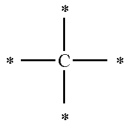

(Y7)

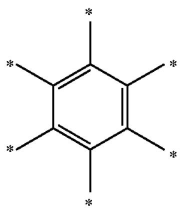

(Y8)

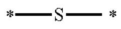

(Y9)

(Y10)

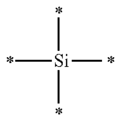

(Y11)

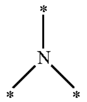

(Y12)

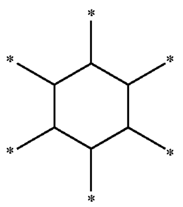

-continued (Y13)

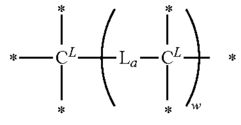

(Y14)

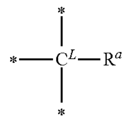

(Y15)

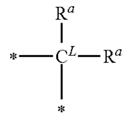

l is not particularly limited as long as it is an integer equal to or greater than 2. The upper limit of l is not particularly limited, but is preferably an integer equal to or smaller than 15. Particularly, in view of further improving the dispersibility of the inorganic substance in the cured substance, l is preferably 2 to 10, more preferably 2 to 6, even more preferably 3 to 6, and particularly preferably 5 or 6.

$L^{21}$ represents a single bond or a divalent linking group. The divalent linking group is not particularly limited, and examples thereof include a —O—, —S—, —CO—, —CH═N—, —N═CH—, —N═N—, —NR— (R represents a hydrogen atom or an alkyl group), a divalent hydrocarbon group (for example, an alkylene group, an alkenylene group (example: —CH═CH—), an alkynylene group (example: —C≡C—), and an arylene group), and a group obtained by combining these. Particularly, in view of further improving the thermal conductivity of the cured substance, $L^{21}$ is preferably a divalent linking group represented by General Formula (9).

$$*3\text{-}L^{23}\text{-}(T^{21}\text{-}Z^{21})_q\text{-}*4 \qquad (9)$$

In General Formula (9), $L^{23}$ represents a single bond or a divalent linking group. $T^{21}$ each independently represents a divalent aromatic hydrocarbon ring group or a divalent aromatic heterocyclic group. $Z^{21}$ each independently represents a single bond or a divalent linking group. q represents an integer of 1 to 5. In a case where q is equal to or greater than 2, a plurality of $T^{21}$'s and $Z^{21}$'s may be the same as or different from each other respectively. *3 represents a position bonded to $A^{21}$. *4 represents a position bonded to $X^{21}$.

$T^{21}$, $Z^{21}$, and q have the same definition as $T^{11}$, $Z^{11}$, and p described above respectively, and preferred aspects thereof are also the same.

$L^{23}$ is preferably a single bond, —O—, —O—CO—, —CO—O—, —C≡C—, —CH═CH—, —CH═N—, —N═CH—, —N═N—, —O-AL-O—, —O-AL-O—CO—, —O-AL-CO—O—, —CO—O-AL-O—, —CO—O-AL-O—CO—, —CO—O-AL-CO—O—, —O—CO-AL-O—, —O—CO-AL-O—CO—, —O—CO-AL-CO—O—, —O-AL-O—CO-AL-S-AL-CO—O-AL-, -AL-O—CO-AL-S-AL-CO—O-AL-O—, —O-AL-CO—O-AL-S-AL-CO—O-AL-, or -AL-O—CO-AL-S-AL-O—CO-AL-O—. AL represents an alkylene group having 1 to 10 carbon atoms. $L^{23}$ is more preferably a single bond, —O—, —O-AL-O—, —O-AL-O—CO—, —O-AL-CO—O—, —CO—O-AL-O—, —CO—O-AL-O—CO—, —CO—O-AL-CO—O—, —O—CO-AL-O—, —O—CO-AL-O—CO—, O—CO-AL-CO—O—, —O-AL-O—CO-AL-S-AL-CO—O-AL-, -AL-O—CO-AL-S-AL-CO—O-AL-O—, —O-AL-CO—O-AL-S-AL-O—CO-AL-, or -AL-CO—O-AL-S-AL-O—CO-AL-O—.

*3 represents a position bonded to $A^{21}$. *4 represents a position bonded to $X^{21}$.

In view of further improving the dispersibility of the inorganic substance, the compound represented by General Formula (2) is preferably a compound represented by General Formula (7).

$$(Y^{21}\text{-}L^{22}\rightarrow A^{22}\leftarrow L^{21}\text{-}X^{21})_l \quad (7)$$

In General Formula (7), $L^{21}$, $X^{21}$, and l have the same definition as $L^{21}$, $X^{21}$, and l in General Formula (2) respectively. $A^{22}$ represents an (l+n)-valent substituent. $L^{22}$ represents a single bond or a divalent linking group. $Y^{21}$ represents a substituent. n represents an integer equal to or greater than 1.

$A^{22}$ represents an (l+n)-valent group (l represents an integer equal to or greater than 2, and n represents an integer equal to or greater than 1).

The value of l+n is not particularly limited as long as it is an integer equal to or greater than 3. The upper limit thereof is not particularly limited, but is preferably an integer equal to or smaller than 15. n is preferably equal to or greater than 2, and more preferably equal to or greater than 3.

$A^{22}$ is preferably, for example, a carbon atom, a silicon atom, a nitrogen atom, a group formed of carbon atom-oxygen atom-carbon atom, a group formed of carbon atom-oxygen atom-carbon atom-oxygen atom-carbon atom, an (l+n)-valent aliphatic hydrocarbon ring, an (l+n)-valent aromatic hydrocarbon ring, or an (l+n)-valent heterocyclic ring. "Group formed of carbon atom-oxygen atom-carbon atom" means a group represented by General Formula (Z9), which will be described later, in which W represents 1 and La represents an oxygen atom. "Group formed of carbon atom-oxygen atom-carbon atom-oxygen atom-carbon atom" means a group represented by General Formula (Z9), which will be described later, in which W represents 2 and La represents an oxygen atom.

The number of carbon atoms contained in the aforementioned aliphatic hydrocarbon ring is preferably 3 to 15, more preferably 3 to 10, and even more preferably 5 to 10.

The number of carbon atoms contained in the aromatic hydrocarbon ring is preferably 6 to 18, more preferably 6 to 14, and even more preferably 6 to 10.

The heterocyclic ring is preferably a 5- to 7-membered ring having at least one N atom, one O atom, one S atom, or one Se atom in the ring structure, and more preferably 5- to 6-membered ring.

Examples of $A^{22}$ include groups represented by General Formulae (Z1) to (Z9). In each of the general formulae, * represents a position bonded to the divalent linking group represented by $L^{21}$ or $L^{22}$. Here, in each of the general formulae, the number of groups represented by $(\text{-}L^{21}\text{-}X^{21})$ is equal to or greater than 2, and the number of groups represented by $(\text{-}L^{22}\text{-}Y^{21})$ is equal to or greater than 1.

In a case where $A^{22}$ represents "carbon atom", $A^{22}$ is a group represented by General Formula (Z4). In a case where $A^{22}$ represents "silicon atom", $A^{22}$ is a group represented by General Formula (Z6). In a case where $A^{22}$ represents "nitrogen atom", $A^{22}$ is a group represented by General Formula (Z7).

The aforementioned "(l+n)-valent aliphatic hydrocarbon ring" is, for example, a group represented by General Formula (Z8) or the like. "(l+n)-valent aromatic hydrocarbon ring" is, for example, a group represented by General Formula (Z5) or the like. "(l+n)-valent heterocyclic ring" is, for example, groups represented by General Formulae (Z1) to (Z3) or the like.

In the group represented by General Formula (Z9), $C^L$ represents a carbon atom or a silicon atom, and W represents 1 to 4. $L_a$ is not particularly limited as long as it is a divalent linking group. Examples of the divalent linking group include —O—, —S—, —$NR^a$—, —CO—, an alkylene group (which may be any of a cyclic, branched, or linear alkylene group), an alkenylene group, an alkynylene group, an arylene group, a heteroarylene group, or a divalent group obtained by combining these. Examples of $R^a$ include a hydrogen atom, an alkyl group (preferably a linear or branched alkyl group having 1 to 10 carbon atoms), a halogen atom (preferably a fluorine atom, a chlorine atom, a bromine atom, or an iodine atom), and an aryl group (preferably an aryl group having 6 to 20 carbon atoms).

(Z1)

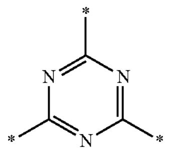

(Z2)

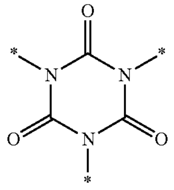

(Z3)

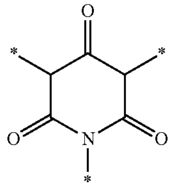

(Z4)

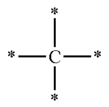

(Z5)

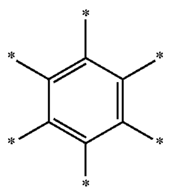

(Z6)

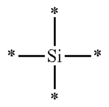

(Z7)

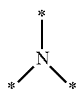

-continued (Z8)

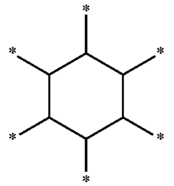

(Z9)

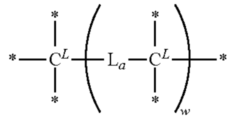

$L^{22}$ represents a single bond or a divalent linking group. The divalent linking group is not particularly limited, and examples thereof include —O—, —S—, —CO—, —CH═N—, —N═CH—, —N═N—, —NR—, (R represents a hydrogen atom or an alkyl group), a divalent hydrocarbon group (for example, an alkylene group, an alkenylene group (example: —CH═CH—), an alkynylene group (example: —C≡C—), and an arylene group), or a group obtained by combining these.

$L^{22}$ is preferably single bond, —O—, —O—CO—, —CO—O—, —C≡C—, —CH═CH—, —CH═N—, —N═CH—, —N═N—, —O-AL-O—, —O-AL-O—CO—, —CO—O-AL-O—, -AL-O—CO-AL-S—, —S-AL-CO—O-AL-, -AL-CO—O-AL-S—, or —S-AL-O—CO-AL-. AL represents an alkylene group having 1 to 10 carbon atoms.

$Y^{21}$ represents a substituent. The type of the substituent is not particularly limited, and examples thereof include the groups listed in the substituent group Y described above. Among these, a fused ring group formed by the induction of a fused ring or a polymer chain which will be described later is preferable. In a case where there is a plurality of $Y^{21}$'s, one or more $Y^{21}$'s may be fused ring groups and polymer chains.

In a case where $Y^{21}$ is a fused ring group formed by the induction of a fused ring, the adsorptivity between the specific compound and the inorganic substance (particularly, the inorganic nitride) is improved, and the dispersibility of the inorganic substance in the cured substance is further improved.

The fused ring group formed by the induction of a fused ring is a group formed by removing one hydrogen atom from a fused ring. The type of the fused ring is not particularly limited. Examples of the fused ring include a fused ring formed by the fusion of two or more rings selected from the group consisting of an aromatic hydrocarbon ring and an aromatic heterocyclic ring. Particularly, in view of adsorptivity, a fused ring formed by the fusion of two or more 6-membered aromatic hydrocarbon rings is preferable, and a pyrene ring, a triphenylene ring, a perylene ring, a naphthopyrene ring, or a perylene tetracarboxylic acid diimide is more preferable.

In a case where the substituent is a polymer chain, the coating effect of the specific compound is improved, and hence the dispersibility of the inorganic substance in the cured substance is further improved.

Examples of the polymer chain include a vinyl-based polymer, an ester-based polymer, an ether-based polymer, a urethane-based polymer, an amide-based polymer, an epoxy-based polymer, a silicone-based polymer, and the like.

In view of further improving the dispersibility of the inorganic substance, the aforementioned polymer chain is preferably a polymer chain having a structural unit represented by General Formula (10).

(10)

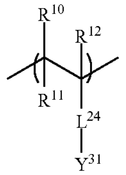

In General Formula (10), $R^{10}$, $R^{11}$, and $R^{12}$ each independently represent a hydrogen atom or a substituent. $L^{24}$ represents a single bond or a divalent linking group. $Y^{31}$ represents a substituent.

$R^{10}$, $R^{11}$, $R^{12}$, $L^{24}$, and $Y^{31}$ have the same definition as $R^1$, $R^2$, $R^3$, $L^{12}$, and $Y^{11}$ described above respectively, and preferred aspects thereof are also the same.

The polymer chain may have one kind of structural unit represented by General Formula (10) or a plurality of kinds of structural units represented by General Formula (10). In a case where the polymer chain contains a plurality of kinds of structural units represented by General Formula (10), it is preferable that at least one kind of structural unit has a fused ring group or a polymerizable group as $Y^{31}$. That is, it is preferable that the polymer chain contains the structural unit represented by General Formula (10) in which $Y^{31}$ represents a fused ring group or a polymerizable group. Furthermore, the polymer chain may contain both the structural unit represented by General Formula (10) in which $Y^{31}$ represents a fused ring group and the structural unit represented by General Formula (10) in which $Y^{31}$ represents a polymerizable group.

In addition, the polymer chain may contain another structural unit different from the structural unit represented by General Formula (10) in which $Y^{31}$ represents a fused ring group or a polymerizable group. Examples of another structural unit described above include a structural unit represented by General Formula (10) in which $Y^{31}$ represents a group having none of the fused ring group and the polymerizable group (for example, a group having none of the fused ring group and the polymerizable group listed in the substituent group Y).

Specific examples of the compound represented by General Formula (2) and the compound represented by General Formula (7) will be shown below, but the present invention is not limited thereto.

In the following specific examples, r, r1, and r2 each represent the content of a structural unit expressed as mol %. r equals 100 mol %, and r1+r2 equals 100 mol %. l and n each represent the number of each of the groups.

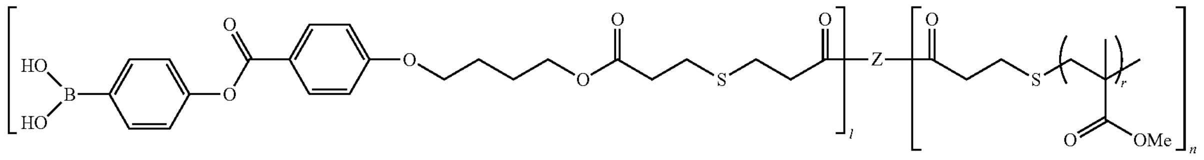
(l + n = 6)
Z = 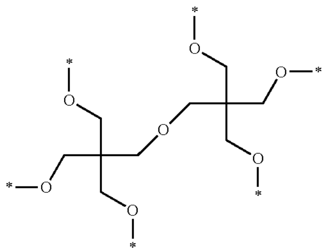
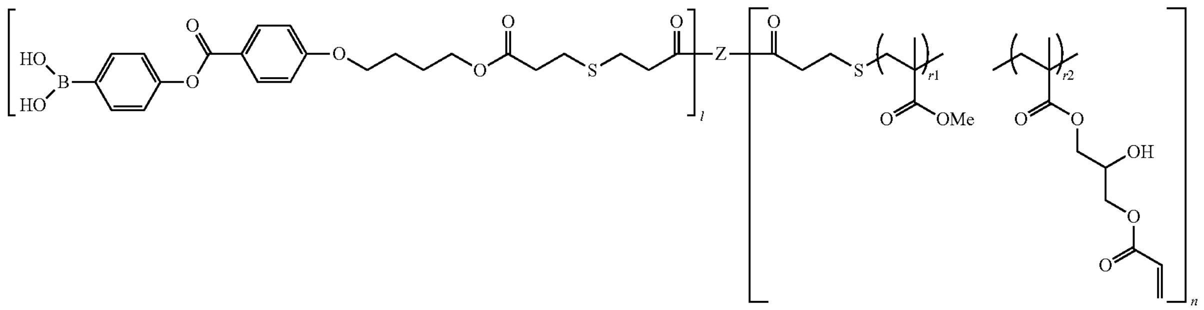
(l + n = 6)
Z = 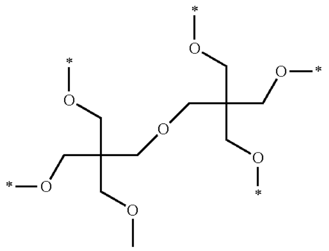
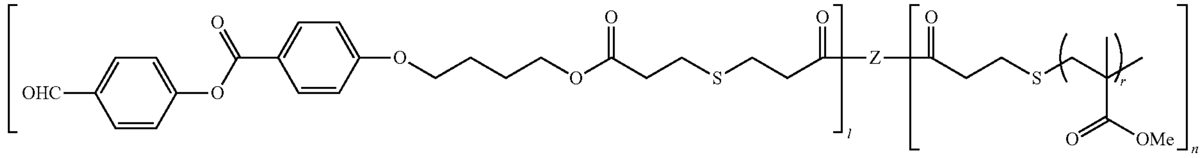
(l + n = 6)
Z = 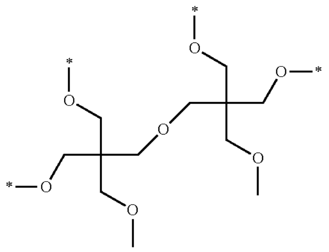

-continued
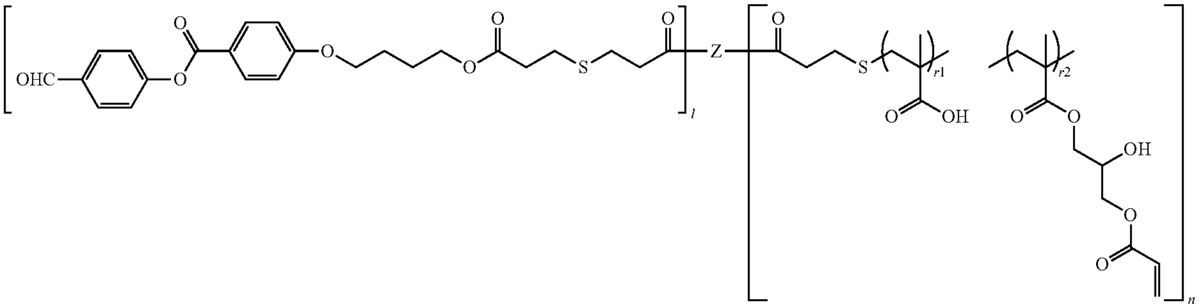
(l + n = 6)
Z = 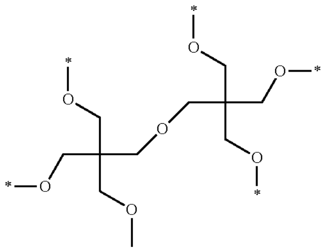
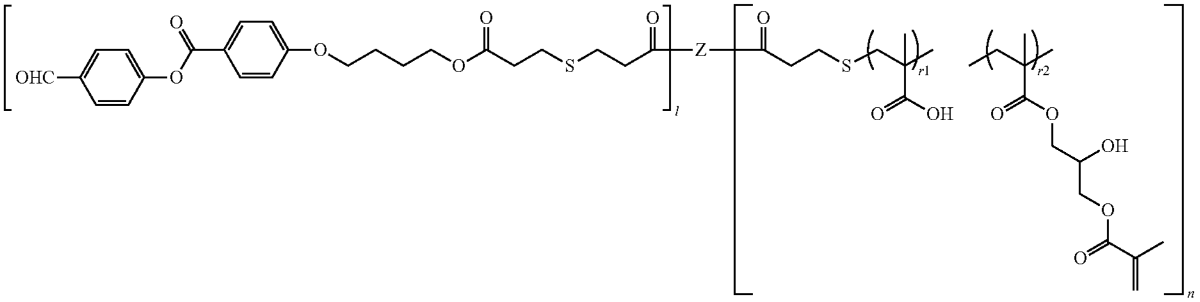
(l + n = 6)
Z = 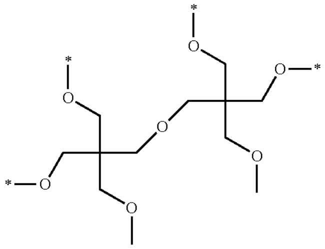

-continued
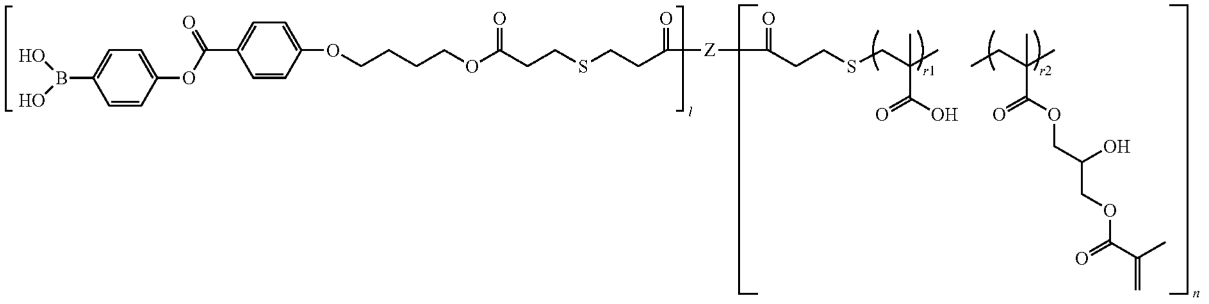
(l + n = 6)
Z =
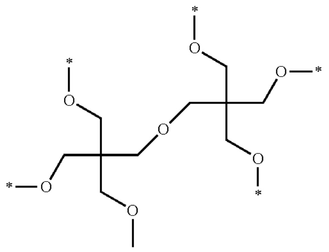
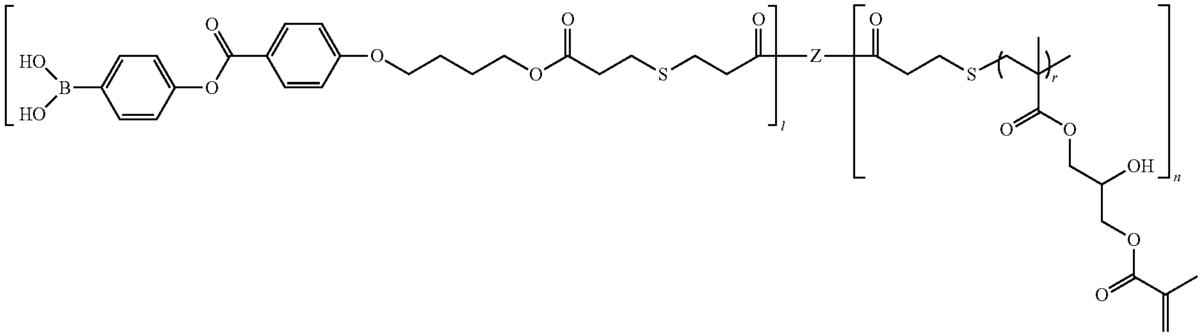
(l + n = 6)
Z =
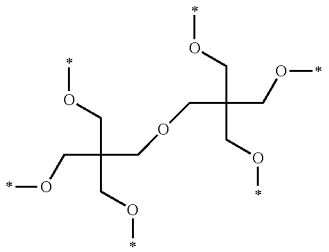

-continued

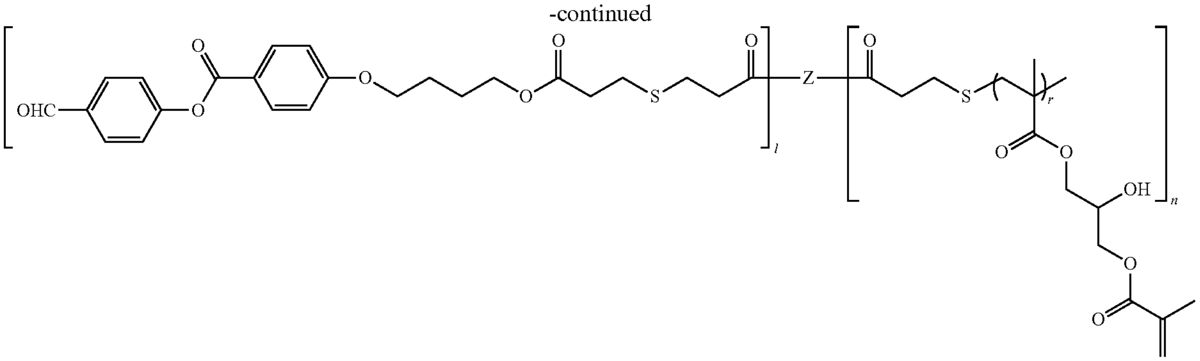

(l + n = 6)

Z =

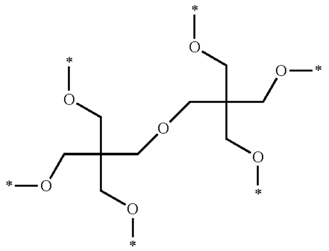

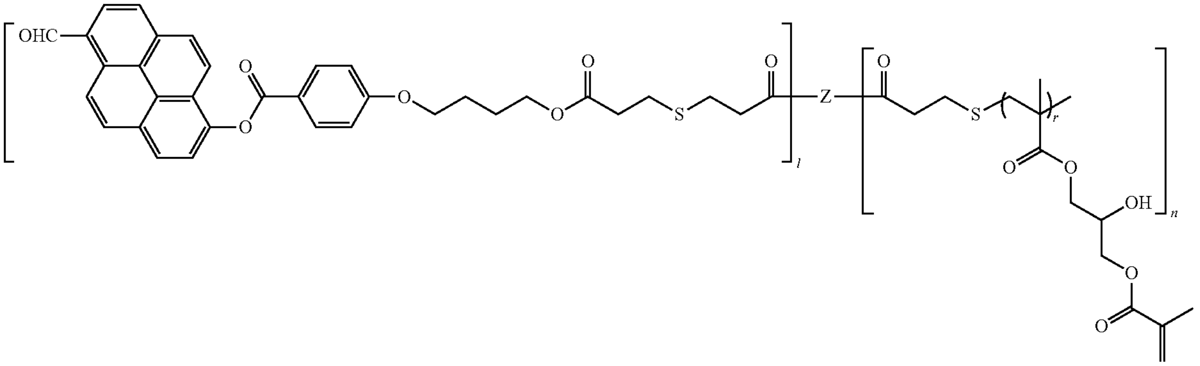

(l + n = 6)

Z =

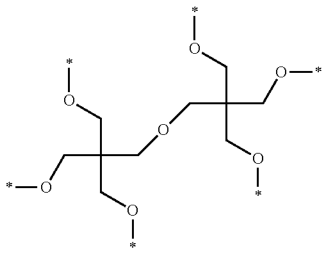

The compound represented by General Formula (2) and the compound represented by General Formula (7) can be synthesized based on known methods.

In view of making the characteristics of the surface-modified inorganic substances more marked, the content of the specific compound in the curable composition with respect to the total solid content in the curable composition is preferably 0.01% to 15% by mass, more preferably 0.1% to 10% by mass, and even more preferably 0.1% to 5% by mass.

In the curable composition, a mass ratio between the specific compound and the inorganic substance selected from the group consisting of an inorganic nitride and an inorganic oxide (mass of specific compound/mass of inorganic substance) is not particularly limited. In view of further improving the dispersibility of the inorganic substance in the cured substance, the mass ratio is preferably 0.0001 to 0.5, and more preferably 0.0005 to 0.1.

The curable composition may contain one kind of specific compound or two or more kinds of specific compounds.

<Polymerizable Monomer>

The curable composition contains a polymerizable monomer.

The polymerizable monomer is a compound cured by being treated with predetermined means such as heat or light.

The polymerizable monomer has a polymerizable group. Examples of the polymerizable group are the same as examples of $Y^{11}$. Among these, in view of reactivity, a group selected from the group consisting of an acryloyl group, a methacryloyl group, an oxiranyl group, and a vinyl group is preferable.

The number of polymerizable groups contained in the polymerizable monomer is not particularly limited. In view of further improving the heat resistance of the cured substance obtained by curing the curable composition, the number of polymerizable groups is preferably equal to or greater than 2, and more preferably equal to or greater than 3. The upper limit thereof is not particularly limited, but in many cases, the upper limit is equal to or smaller than 8.

The type of the polymerizable monomer is not particularly limited, and known polymerizable monomers can be used. Examples thereof include the epoxy resin monomer and the acrylic resin monomer described in paragraph "0028" in JP4118691B, the epoxy compounds described in paragraphs "0006" to "0011" in JP2008-013759A, the epoxy resin mixtures described in paragraphs "0032" to "0100" in JP2013-227451A, and the like.

The content of the polymerizable monomer in the curable composition is not particularly limited. An optional content is appropriately selected according to the use of the curable composition. Particularly, the content of the polymerizable monomer with respect to the total solid content of the curable composition is preferably 10% to 90% by mass, more preferably 15% to 70% by mass, and even more preferably 20% to 60% by mass.

The curable composition may contain one kind of polymerizable monomer or two or more kinds of polymerizable monomers.

It is preferable that the polymerizable monomer exhibits liquid crystallinity. That is, the polymerizable monomer is preferably a liquid crystal compound. In other words, the polymerizable monomer is preferably a liquid crystal compound having a polymerizable group.

It is also preferable that the cured substance of the polymerizable monomer exhibits liquid crystallinity. The cured substance of the polymerizable monomer means a cured substance obtained by curing the polymerizable monomer, and does not contain the specific compound, the inorganic substance, and the like described above. For obtaining the cured substance, if necessary, a curing agent which will be described later may be used.

As described above, it is preferable that the polymerizable monomer or a cured substance thereof exhibits liquid crystallinity. That is, the polymerizable monomer or a cured substance thereof is preferably a liquid crystal component.

The polymerizable monomer may be any of a rod-like liquid crystal compound or a disk-like liquid crystal compound. That is, the polymerizable monomer may be any of a rod-like liquid crystal compound having a polymerizable group and a disk-like liquid crystal compound having a polymerizable group.

Hereinafter, the rod-like liquid crystal compound and the disk-like liquid crystal compound will be specifically described.

(Rod-Like Liquid Crystal Compound)

As the rod-like liquid crystal compound, azomethines, azoxies, cyanobiphenyls, cyanophenyl esters, benzoic acid esters, cyclohexane carboxylic acid phenyl esters, cyanophenyl cyclohexanes, cyano-substituted phenylpyrimidines, alkoxy-substituted phenylpyrimidines, phenyldioxanes, tolans, and alkenylcyclohexyl benzonitriles are preferable. In addition to these low-molecular weight liquid crystal compounds, high-molecular weight liquid crystal compounds can also be used. The aforementioned high-molecular weight liquid crystal compounds are polymer compounds obtained by polymerizing rod-like liquid crystal compounds having a low-molecular weight reactive group.

Examples of preferable rod-like liquid crystal compounds include a rod-like liquid crystal compound represented by General Formula (XXI).

General Formula (XXI): $Q^1\text{-}L^{111}\text{-}A^{111}\text{-}L^{113}\text{-}M\text{-}L^{114}\text{-}A^{112}\text{-}L^{112}\text{-}Q^2$ In the formula, $Q^1$ and $Q^2$ each independently represent a polymerizable group, and $L^{111}$, $L^{112}$, $L^{113}$, and $L^{114}$ each independently represent a single bond or a divalent linking group. $A^{111}$ and $A^{112}$ each independently represent a divalent linking group (spacer group) having 1 to 20 carbon atoms. M represents a mesogenic group.

The definition of the polymerizable group is as described above.

At least one of $Q^1$ or $Q^2$ preferably represents an oxiranyl group, and both of $Q^1$ and $Q^2$ more preferably represent an oxiranyl group.

As the divalent linking group represented by $L^{111}$, $L^{112}$, $L^{113}$, and $L^{114}$, a divalent linking group is preferable which is selected from the group consisting of —O—, —S—, —CO—, —$NR^{112}$—, —CO—O—, —O—CO—O—, —CO—$NR^{112}$—, —$NR^{112}$—CO—, —O—CO—, —$CH_2$—O—, —O—$CH_2$—, —O—CO—$NR^{112}$—, —$NR^{112}$—CO—O—, and —$NR^{112}$—CO—$NR^{112}$—. $R^{112}$ is an alkyl group having 1 to 7 carbon atoms or a hydrogen atom.

$A^{111}$ and $A^{112}$ each represent a divalent linking group having 1 to 20 carbon atoms. Particularly, $A^{111}$ and $A^{112}$ preferably each represent an alkylene group having 1 to 12 carbon atoms, an alkenylene group having 1 to 12 carbon atoms, or an alkynylene group having 1 to 12 carbon atoms, and more preferably each represent an alkylene group having 1 to 12 carbon atoms.

The divalent linking group is preferably linear and may contain oxygen atoms or sulfur atoms that are not adjacent to each other. Furthermore, the divalent linking group may have a substituent, and examples of the substituent include a halogen atom (a fluorine atom, a chlorine atom, or a bromine atom), a cyano group, a methyl group, and an ethyl group.

Examples of the mesogenic group represented by M include known mesogenic groups. Particularly, a group represented by General Formula (XXII) is preferable.

$$—(W^1\text{-}L^{115})_n\text{-}W^2— \quad \text{General Formula (XXII):}$$

In the formula, $W^1$ and $W^2$ each independently represent a divalent cyclic alkylene group or a divalent cyclic alkenylene group, an arylene group, or a divalent heterocyclic group, and $L^{115}$ represents a single bond or a divalent linking group. n represents 1, 2, or 3.

Examples of $W^1$ and $W^2$ include 1,4-cyclohexanediyl, 1,4-phenylene, pyrimidine-2,5-diyl, pyridine-2,5-diyl, 1,3,4-thiadiazole-2,5-diyl, 1,3,4-oxadiazole-2,5-diyl, naphthalene-2,6-diyl, naphthalene-1,5-diyl, thiophene-2,5-diyl, and pyridazine-3,6-diyl. In a case where $W^1$ and $W^2$ each represent 1,4-cyclohexanediyl, the compound may any of constitutional isomers of a trans-isomer and a cis-isomer, or a mixture in which the isomers are mixed at any ratio. Among these, a trans-isomer is preferable.

Each of $W^1$ and $W^2$ may have a substituent. Examples of the substituent include groups listed in the substituent group Y. More specifically, examples of the substituent include a halogen atom (a fluorine atom, a chlorine atom, a bromine atom, and an iodine atom), a cyano group, an alkyl group having 1 to 10 carbon atoms (for example, a methyl group, an ethyl group, a propyl group, or the like), an alkoxy group having 1 to 10 carbon atoms (for example, a methoxy group, an ethoxy group, or the like), an acyl group having 1 to 10 carbon atoms (for example, a formyl group, an acetyl group, or the like), an alkoxycarbonyl group having 1 to 10 carbon atoms (for example, a methoxycarbonyl group, an ethoxycarbonyl group, or the like), an acyloxy group having 1 to 10 carbon atoms (for example, an acetyloxy group, a propionyloxy group, or the like), a nitro group, a trifluoromethyl group, a difluoromethyl group, and the like.

Examples of the divalent linking group represented by $L^{115}$ include the specific examples of the divalent linking group represented by $L^{111}$ to $L^{114}$ described above, such as $-CO-O-$, $-O-CO-$, $-CH_2-O-$, and $-O-CH_2-$.

Examples of those preferable as the basic skeleton of the mesogenic group represented by General Formula (XXII) will be shown below, and these may be substituted with the aforementioned substituent.

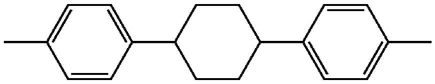

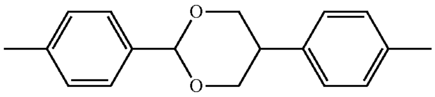

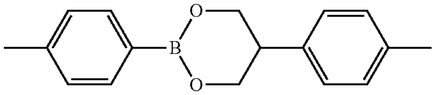

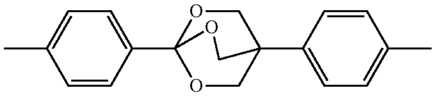

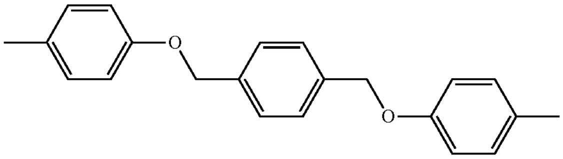

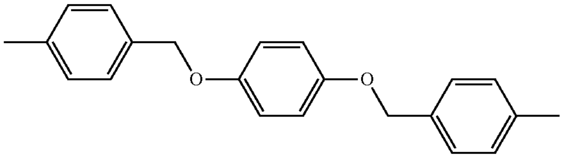

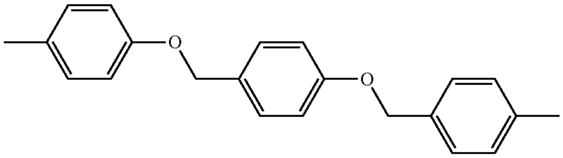

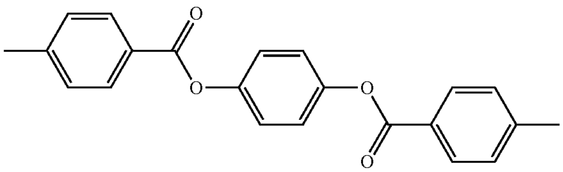

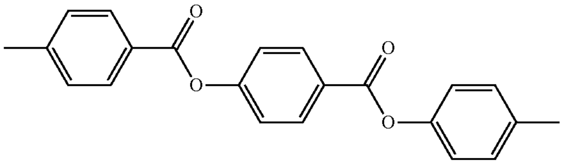

-continued

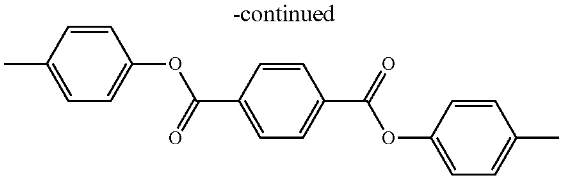

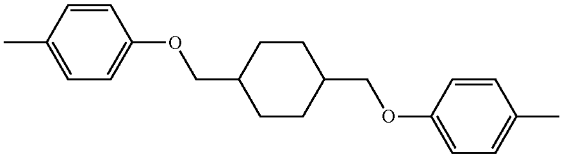

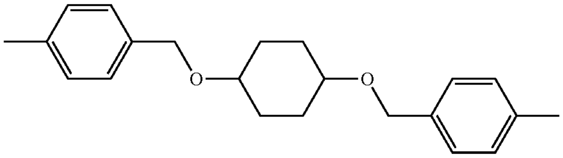

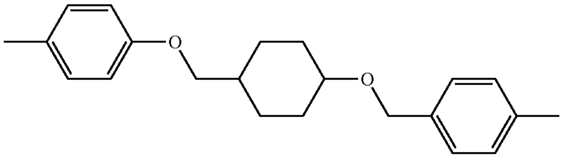

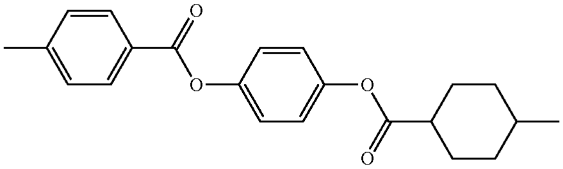

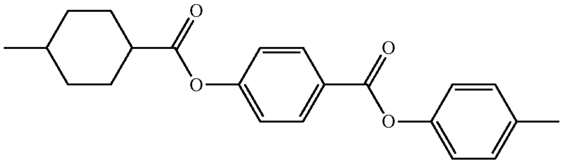

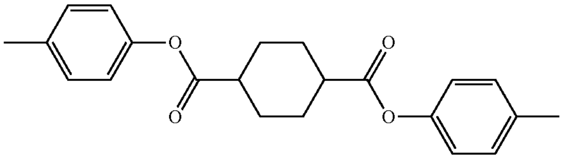

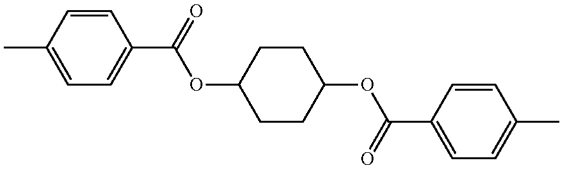

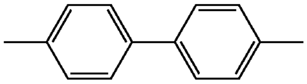

The compound represented by General Formula (XXI) can be synthesized with reference to the method described in JP1999-513019A (JP-H11-513019A) (WO97/000600).

The rod-like liquid crystal compound may be a monomer having the mesogenic group described in JP1999-323162A (JP-H11-323162A) and JP4118691B.

(Disk-Like Liquid Crystal Compound)

The disk-like liquid crystal compound has a disk-like structure in at least a portion thereof. The disk-like structure refers has at least an aromatic ring. Therefore, the disk-like liquid crystal compound can form a columnar structure by forming a stacking structure based on the intermolecular π-π interaction.

Specific examples of the disk-like structure include the triphenylene structure described in Angew. Chem. Int. Ed. 2012, 51, 7990-7993 or JP1995-306317A (JP-H07-306317A), the trisubstituted benzene structure described in JP2007-002220A or JP2010-244038A, and the like.

Particularly, in a case where the disk-like liquid crystal compound is used as the polymerizable monomer, a thermally conductive material showing high thermal conductivity is obtained. According to the inventors, the reason is as below. While the rod-like liquid crystal compound can only linearly (one-dimensionally) conduct heat, the disk-like liquid crystal compound can flatwise (two-dimensionally) conduct heat in a normal direction, and accordingly, the number of heat conduction paths increase, and the thermal conductivity is improved.

Furthermore, in a case where the disk-like liquid crystal compound is used, the heat resistance of the cured substance of the curable composition is improved.

It is preferable that the disk-like liquid crystal compound has three or more polymerizable groups. The cured substance of the curable composition containing the disk-like liquid crystal compound having three or more polymerizable groups tends to have a high glass transition temperature and high heat resistance. Compared to a rod-like liquid crystal compound, the disk-like liquid crystal compound more likely to have three or more polymerizable groups without affecting the characteristics of a mesogenic portion. The number of polymerizable groups contained in the disk-like liquid crystal compound is preferably equal to or smaller than 8, and more preferably equal to or smaller than 6. It is preferable that all the polymerizable groups are oxiranyl groups.

As the disk-like liquid crystal compound, a compound represented by General Formula (XI) or a compound represented by General Formula (XII) is preferable.

General Formula XI

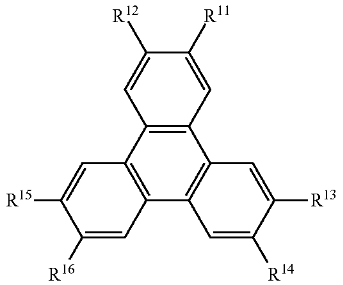

In the formula, $R^{11}$, $R^{12}$, $R^{13}$, $R^{14}$, $R^{15}$, and $R^{16}$ each independently represent *—$X^{11}$-$L^{11}$-$p^{11}$ or *—$X^{12}$—$Y^{12}$, * represents a position bonded to a triphenylene ring, two or more among $R^{11}$, $R^{12}$, $R^{13}$, $R^{14}$, $R^{15}$, and $R^{16}$ represent *—$X^{11}$-$L^{11}$-$P^{11}$, $X^{11}$ and $X^{12}$ each independently represent a single bond, —O—, —C(═O)—, —OC(═O)—, —OC(═O)O—, —OC(═O)NH—, —OC(═O)S—, —C(═O)O—, —C(═O)NH—, —C(═O)S—, —NHC(═O)—, —NHC(═O)O—, —NHC(═O)NH—, —NHC(═O)S—, —S—, —SC(═O)—, —SC(═O)O—, —SC(═O)NH—, or —SC(═O)S—, $L^{11}$ represents a divalent linking group or a single bond, $P^{11}$ represents a polymerizable group, $Y^{12}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N($CH_3$)—, —C(═O)—, —OC(═O)—, or —C(═O)O—.

It is preferable that three or more out of $R^{11}$, $R^{12}$, $R^{13}$, $R^{14}$, $R^{15}$, and $R^{16}$ represent *—$X^{11}$-$L^{11}$-$P^{11}$. Particularly, it is more preferable that any one or more out of $R^{11}$ and $R^{12}$, any one or more out of $R^{13}$ and $R^{14}$, and any one or more out of $R^{15}$ and $R^{16}$ represent *—$X^{11}$-$L^{11}$-$P^{11}$. It is even more preferable that all of $R^{11}$, $R^{12}$, $R^{13}$, $R^{14}$, $R^{15}$, and $R^{16}$ represent *—$X^{11}$-$L^{11}$-$P^{11}$. It is particularly preferable that all of $R^{11}$, $R^{12}$, $R^{13}$, $R^{14}$, $R^{15}$, and $R^{16}$ represent the same group represented by *-$X^{11}$-$L^{11}$-$P^{11}$.

$X^{11}$ and $X^{12}$ each independently preferably represent —O—, —OC(═O)—, —OC(═O)O—, —OC(═O)NH—, —C(═O)O—, —C(═O)NH—, —NHC(═O)—, or NHC(═O)O—, more preferably represent —OC(═O)—, —C(═O)O—, —OC(═O)NH—, or —C(═O)NH—, and even more preferably represent —C(═O)O—.

$L^{11}$ represents a divalent linking group or a single bond linking $X^{11}$ and $P^{11}$ to each other. Examples of the divalent linking group include —O—, —OC(═O)—, —C(═O)O—, an alkylene group having 1 to 10 carbon atoms (preferably having 1 to 8 carbon atoms and more preferably having 1 to 6 carbon atoms), an arylene group having 6 to 20 carbon atoms (preferably having 6 to 14 carbon atoms and more preferably having 6 to 10 carbon atoms), a group obtained by combining these, and the like.

Examples of the alkylene group having 1 to 10 carbon atoms include a methylene group, an ethylene group, a propylene group, a butylene group, a pentylene group, a hexylene group, and the like.

Examples of the arylene group having 6 to 20 carbon atoms include a 1,4-phenylene group, a 1,3-phenylene group, a 1,4-naphthylene group, a 1,5-naphthylene group, an anthracenylene group, and the like. Among these, a 1,4-phenylene group is preferable.

Each of the alkylene group and the arylene group may have a substituent. Examples of the substituent include the groups listed in the substituent group Y. The number of substituents is preferably 1 to 3, and more preferably 1. The substitution position of the substituent is not particularly limited. As the substituent, a halogen atom or an alkyl group having 1 to 3 carbon atoms is preferable, and a methyl group is more preferable. It is also preferable that the alkylene group and the arylene group are unsubstituted. Particularly, it is preferable that the alkylene group is unsubstituted.

$P^{11}$ represents a polymerizable group. The definition of the polymerizable group is as described above.

$P^{11}$ is preferably an oxiranyl group.

In a case where $P^{11}$ is a hydroxy group, $L^{11}$ includes an arylene group, and it is preferable that the arylene group is bonded to $P^{11}$.

$Y^{12}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N($CH_3$)—, —C(═O)—, —OC(═O)—, or —C(═O)O—.

In a case where $Y^{12}$ represents a linear, branched, or cyclic alkyl group having 1 to 20 carbon atoms or a group obtained in a case where one methylene group or two or more methylene groups in a linear, branched, or cyclic alkyl group having 1 to 20 carbon atoms are substituted with —O—, —S—, —NH—, —N($CH_3$)—, —C(═O)—, —OC(═O)—, or —C(═O)O—, $Y^{12}$ may be substituted with a halogen atom.

Examples of the linear or branched alkyl group having 1 to 20 carbon atoms include a methyl group, an ethyl group, a n-propyl group, an isopropyl group, a n-butyl group, an isobutyl group, a sec-butyl group, a tert-butyl group, a n-pentyl group, an isopentyl group, a neopentyl group, a 1,1-dimethylpropyl group, a n-hexyl group, an isohexyl group, a linear or branched heptyl group, an octyl group, a nonyl group, a decyl group, an undecyl group, and a dodecyl group.

The number of carbon atoms in the cyclic alkyl group is preferably equal to or greater than 3, and more preferably equal to or greater than 5. The number of carbon atoms in the cyclic alkyl group is preferably equal to or smaller than 20, more preferably equal to or smaller than 10, even more preferably equal to or smaller than 8, and particularly preferably equal to or smaller than 6. Examples of the cyclic alkyl group include a cyclopropyl group, a cyclobutyl group, a cyclopentyl group, a cyclohexyl group, a cycloheptyl group, and a cyclooctyl group.

$Y^{12}$ is preferably a hydrogen atom, a linear, branched, or cyclic alkyl group having 1 to 20 carbon atoms, or an alkylene oxide group having 1 to 20 carbon atoms, and more preferably a linear or branched alkyl group having 1 to 12 carbon atoms or an ethylene oxide group or propylene oxide group having 1 to 20 carbon atoms.

Regarding specific examples of the compound represented by General Formula (XI), those described in paragraphs "0028" to "0036" in JP1995-281028A (JP-H07-281028A), JP1995-306317A (JP-H07-306317A), paragraphs "0016" to "0018" in JP2005-156822A, paragraphs "0067" to "0072" in JP2006-301614A, and Liquid Crystal Handbook (published on 2000 from MARUZEN Co., Ltd.), pp. 330 to 333 can be referred to.

General Formula (XII)

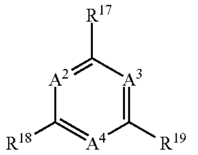

In the formula, $A^2$, $A^3$, and $A^4$ each independently represent —CH═ or —N═, $R^{17}$, $R^{18}$, and $R^{19}$ each independently represent $*—X^{211}—(Z^{21}—X^{212})_{n21}\text{-}L^{21}\text{-}P^{21}$ or $*—X^{211}—(Z^{22}—X^{222})_{n22}—Y^{22}$, * represents a position bonded to a central ring, two or more among $R^{17}$, $R^{18}$, and $R^{19}$ represent $*—X^{211}—(Z^{21}—X^{212})_{n21}\text{-}L^{21}\text{-}P^{21}$, $X^{211}$ and $X^{212}$ each independently represent a single bond, —O—, —C(═O)—, —OC(═O)—, —OC(═O)O—, —OC(═O)NH—, —OC(═O)S—, —C(═O)O—, —C(═O)NH—, —C(═O)S—, —NHC(═O)—, —NHC(═O)O—, —NHC(═O)NH—, —NHC(═O)S—, —S—, —SC(═O)—, —SC(═O)O—, —SC(═O)NH—, or SC(═O)S—, $Z^{21}$ and $Z^{22}$ each independently represent an aromatic group as a 5-membered or 6-membered ring or a non-aromatic group as a 5-membered or 6-membered ring, $L^{21}$ represents a divalent linking group or a single bond linking $X^{212}$ and $P^{21}$to each other, $P^{21}$ represents a polymerizable group, $Y^{22}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N($CH_3$)—, —C(═O)—, —OC(═O)—, or —C(═O)O—, n21 and n22 each independently represent an integer of 0 to 3, and in a case where each of n21 and n22 is equal to or greater than 2, a plurality of groups represented by $Z^{21}—X^{212}$ and $Z^{22}—X^{222}$ may be the same as or different from each other.

It is preferable that all of $R^{17}$, $R^{18}$, and $R^{19}$ represent $*—X^{211}—(Z^{21}—X^{212})_{n21}\text{-}L^{21}\text{-}P^{21}$. It is more preferable that all of $R^{17}$, $R^{18}$, and $R^{19}$ represent the same group represented by $*—X^{211}—(Z^{21}—X^{212})_{n21}\text{-}L^{21}—P^{21}$.

As $X^{221}$ and $X^{222}$, a single bond or —OC(═O)— are preferable.

$Z^{21}$ and $Z^{22}$ each independently represent an aromatic group as a 5-membered or 6-membered ring or a non-aromatic group as a 5-membered or 6-membered ring. Examples thereof include a 1,4-phenylene group, a 1,3-phenylene group, a divalent heterocyclic group, and the like.

The aromatic group and the non-aromatic group described above may have a substituent. Examples of the substituent include the groups listed in the substituent group Y. The number of substituents is preferably 1 or 2, and more preferably 1. The substitution position of the substituent is not particularly limited. As the substituent, a halogen atom or a methyl group is preferable. As the halogen atom, a chlorine atom or a fluorine atom is preferable. It is also preferable that the aromatic group and the non-aromatic group are unsubstituted.

Examples of the divalent heterocyclic ring include the following heterocyclic rings.

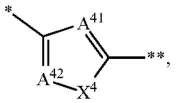,
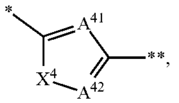,
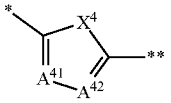

In the formulae, * represents a portion bonded to $X^{211}$, ** represents a portion bonded to $X^{212}$; $A^{41}$ and $A^{42}$ each independently represent a methine group or a nitrogen atom; and $X^4$ represents an oxygen atom, a sulfur atom, a methylene group, or an imino group.

It is preferable that at least one of $A^{41}$ or $A^{42}$ represents a nitrogen atom. It is more preferable that both of $A^{41}$ and $A^{42}$ represent a nitrogen atom. Furthermore, it is preferable that $X^4$ represents an oxygen atom.

$L^{21}$ represents a divalent linking group or a single bond linking $X^{212}$ and $P^{21}$ to each other, and has the same definition as $L^{11}$ in General Formula (XI). As $L^{21}$, —O—, —OC(═O)—, —C(═O)O—, an alkylene group having 1 to 10 carbon atoms (preferably having 1 to 8 carbon atoms and more preferably having 1 to 6 carbon atoms), or a group obtained by combining these is preferable.

$P^{21}$ represents a polymerizable group. The definition of the polymerizable group is as described above.

$Y^{22}$ each independently represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N($CH_3$)—, —C(═O)—, —OC(═O)—, or —C(═O)O—. $Y^{22}$ has the same definition as $Y^{12}$ in General Formula (XI), and the preferred ranges thereof are also the same.

n21 and n22 each independently represent an integer of 0 to 3. n21 and n22 each independently preferably represent an integer of 1 to 3, and more preferably represent 2 or 3.

Regarding the details and specific examples of the compound represented by General Formula (XII), the description in paragraphs "0013" to "0077" in JP2010-244038A can be referred to, and the contents thereof are incorporated into the present specification.

In view of reinforcing stacking by reducing electron density and making it easy to form a columnar aggregate, it is preferable that the compound represented by General Formula (XI) or (XII) is a compound having a hydrogen bonding functional group.

Examples of the hydrogen bonding functional group include —OC(═O)NH—, —C(═O)NH—, —NHC(═O)—, —NHC(═O)O—, —NHC(═O)NH—, —NHC(═O)S—, SC(═O)NH—, and the like.

Specific examples of compounds particularly preferred as the compound represented by General Formula (XI) and the compound represented by General Formula (XII) include the following compounds.

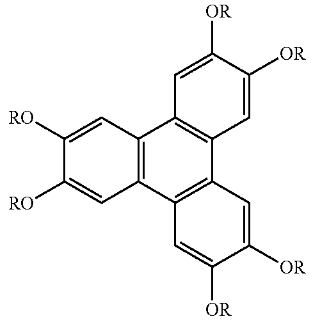

R =
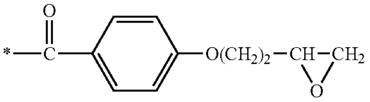

R =
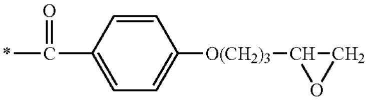

R =
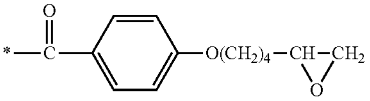

R =
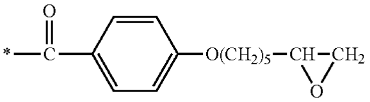

R =
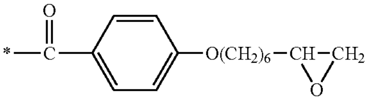

R =
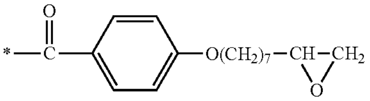

R =
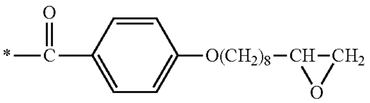

R =
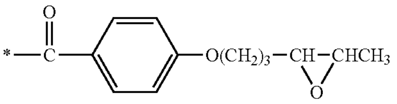

-continued

R =
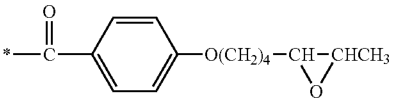

R =
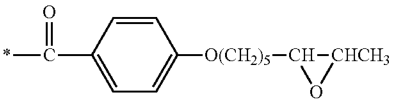

R =
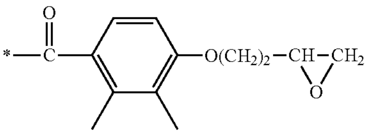

R =
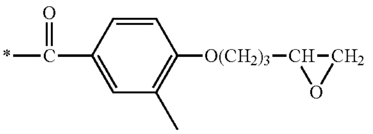

R =
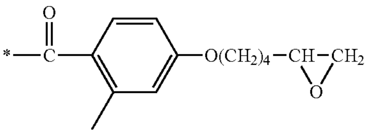

R =
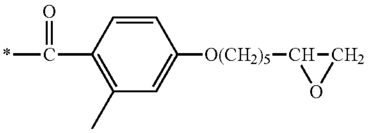

R =
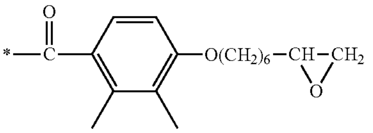

R =
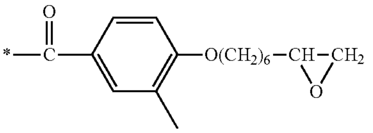

R =
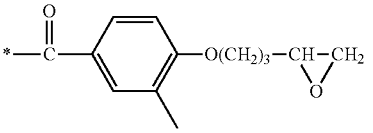

R =
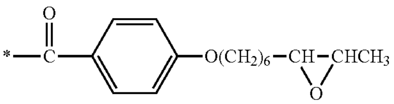

R =
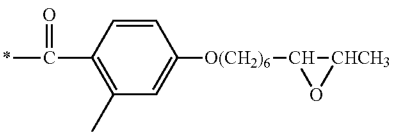

R =
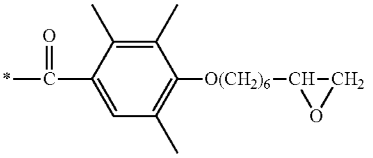

-continued
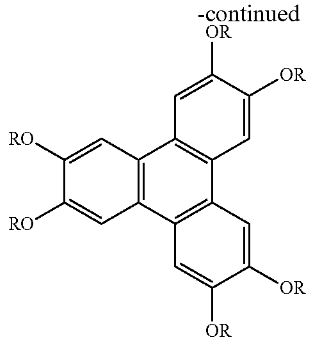
R =
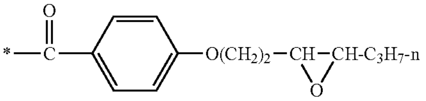
R =
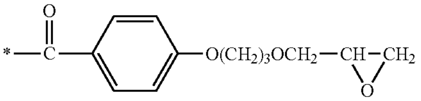
R =
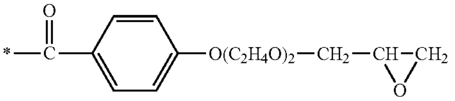
R =
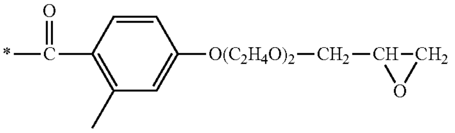
R =
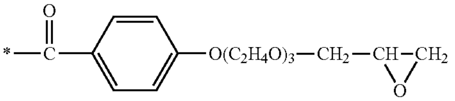
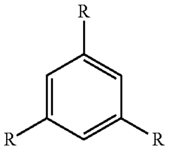
R =
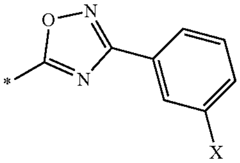
X =
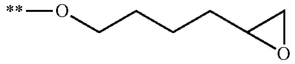
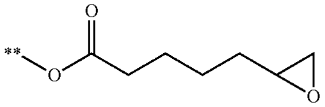
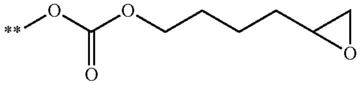
** represents a binding position. The same is true for the following description.
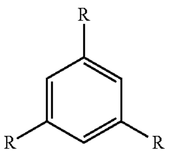
-continued
R =
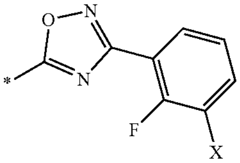
X =
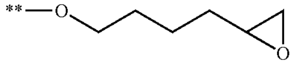
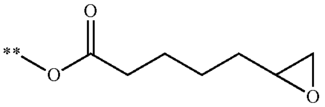
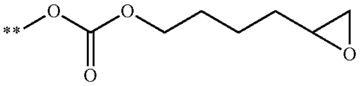
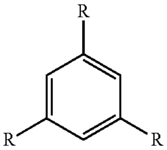
R =
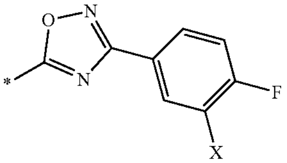
X =
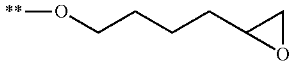
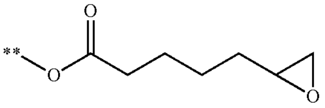
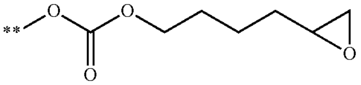
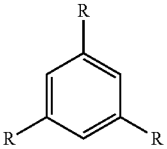
R =
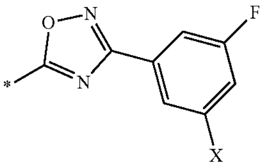
X =
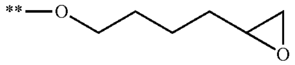
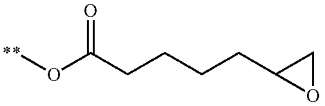

-continued
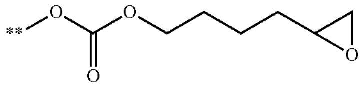
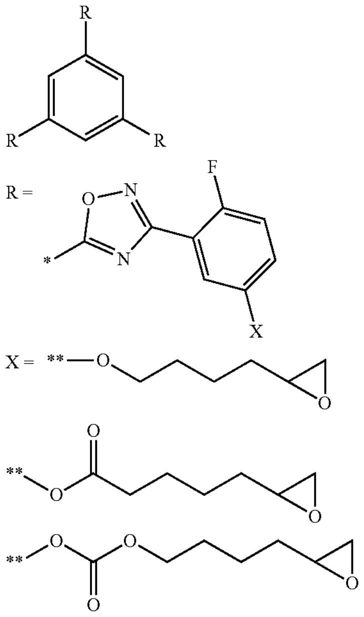
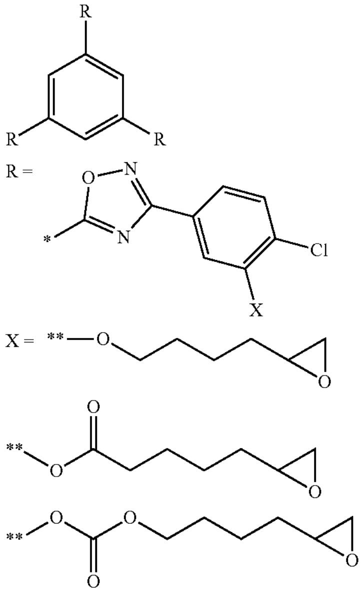
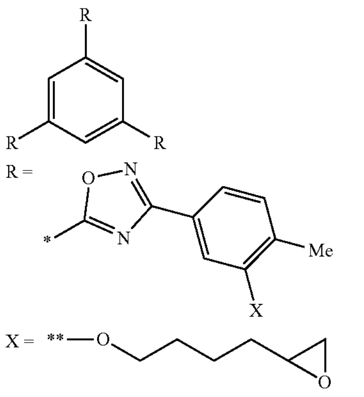
-continued
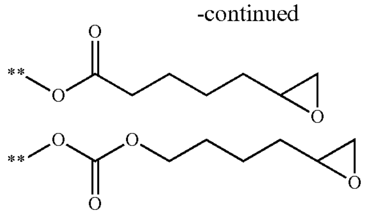
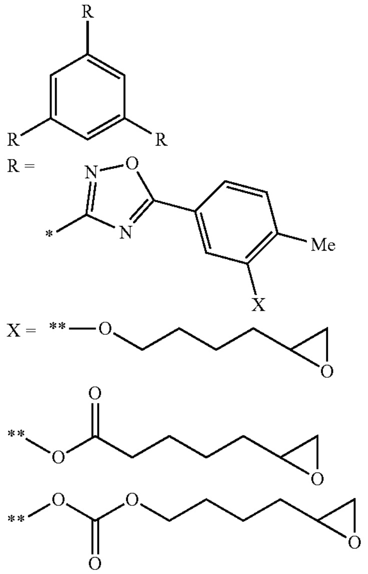
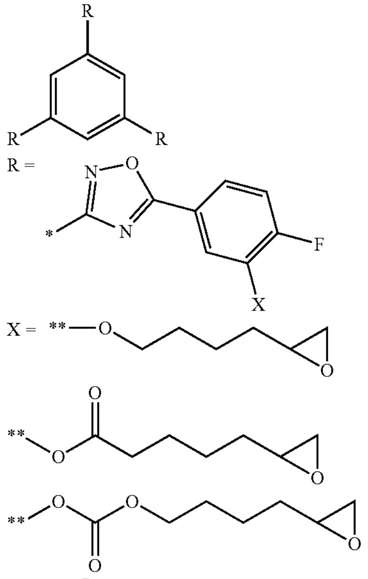
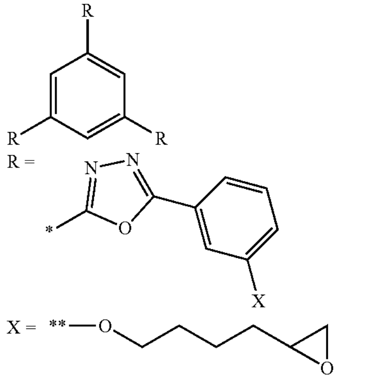

-continued
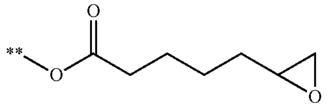
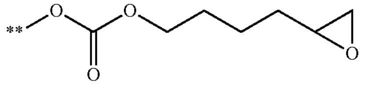
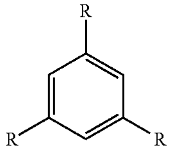
R =
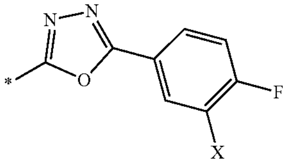
X =
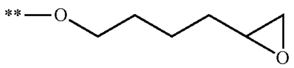
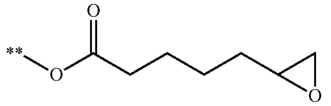
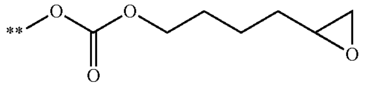
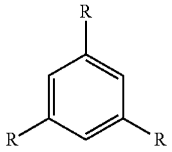
R =
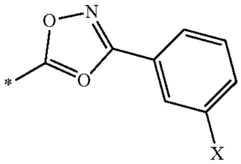
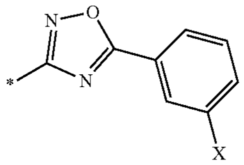
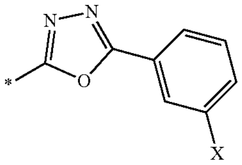
X =
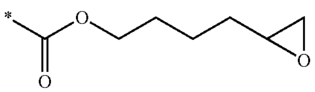
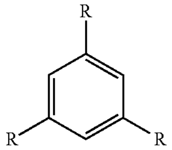
-continued
R =
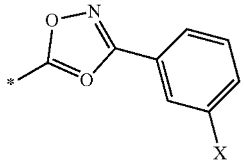
X =
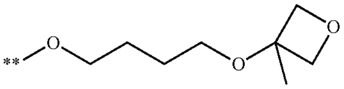
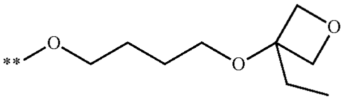
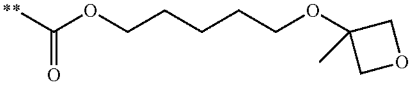
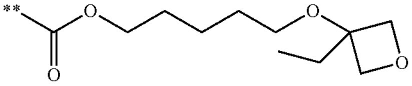
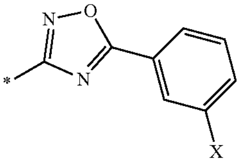
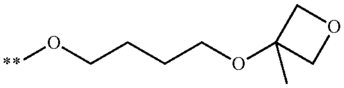
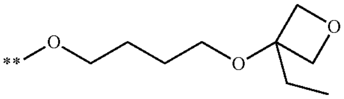
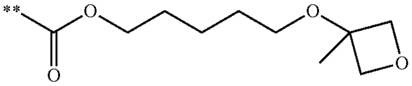
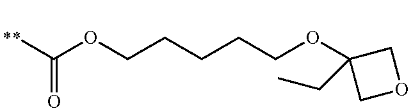
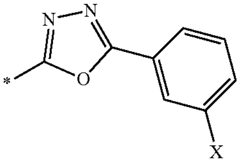

-continued
X =
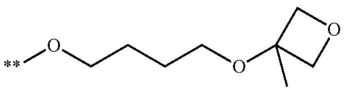
X =
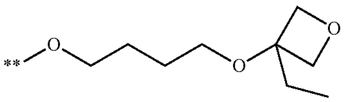
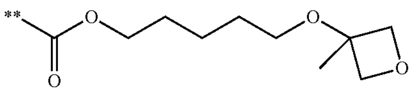
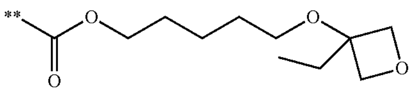
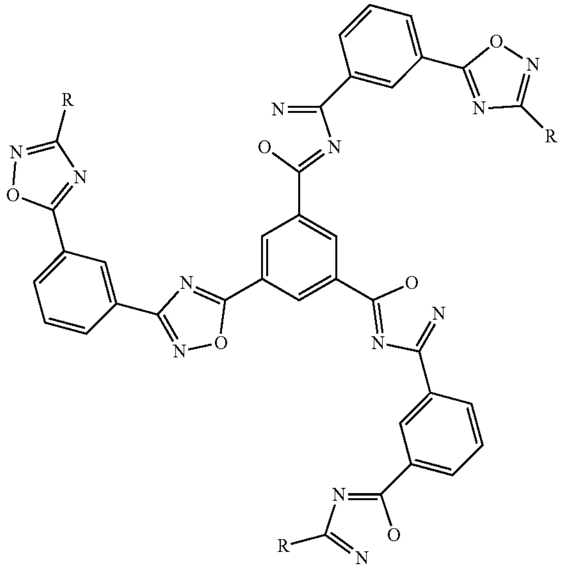
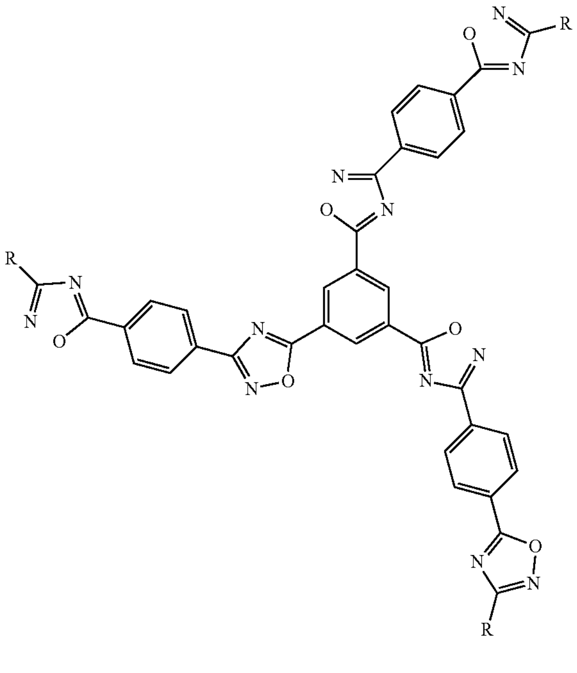
-continued
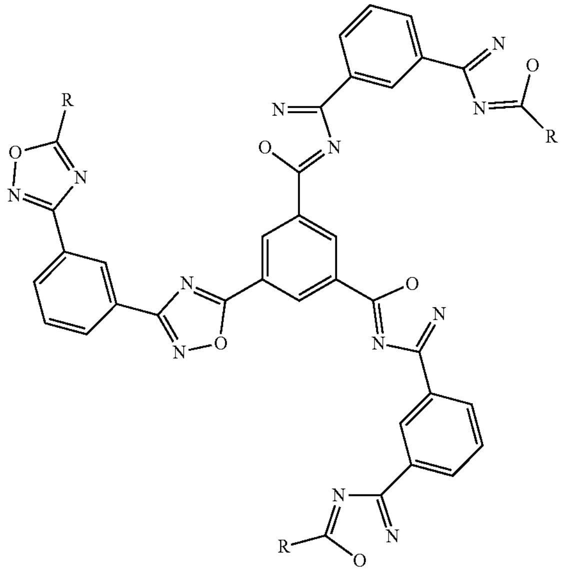
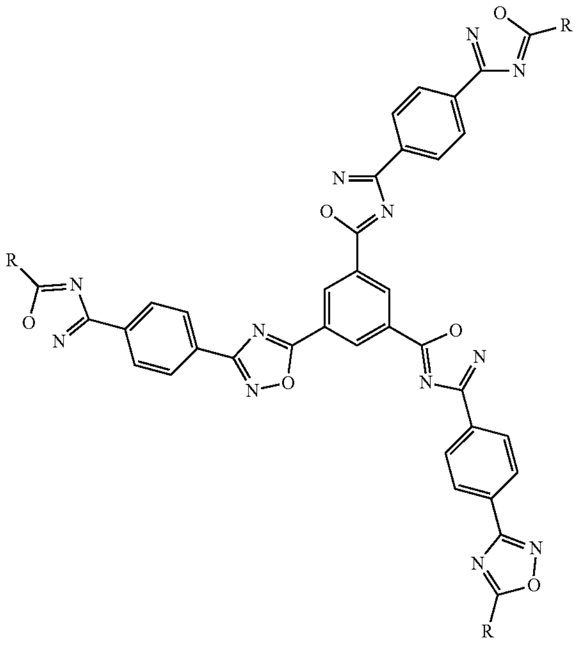

-continued

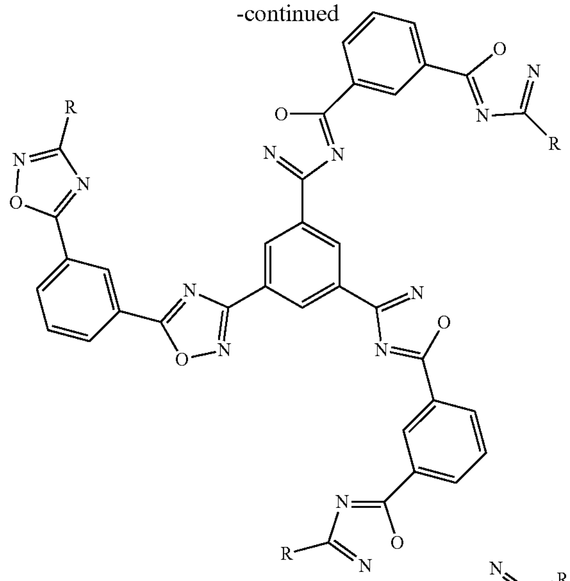

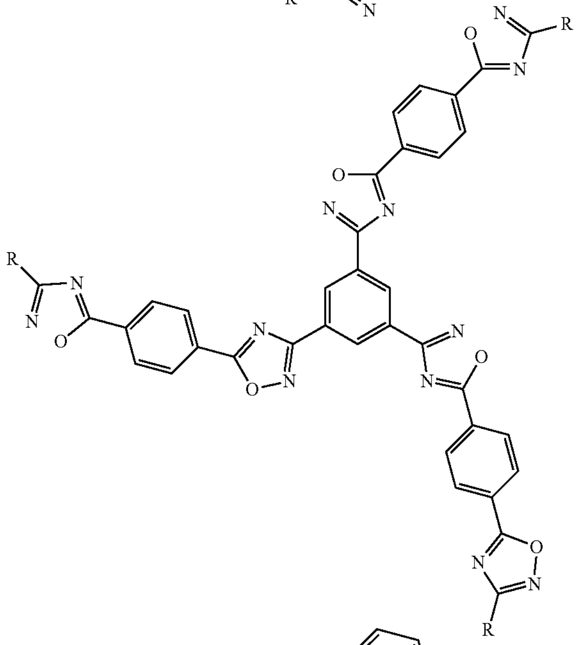

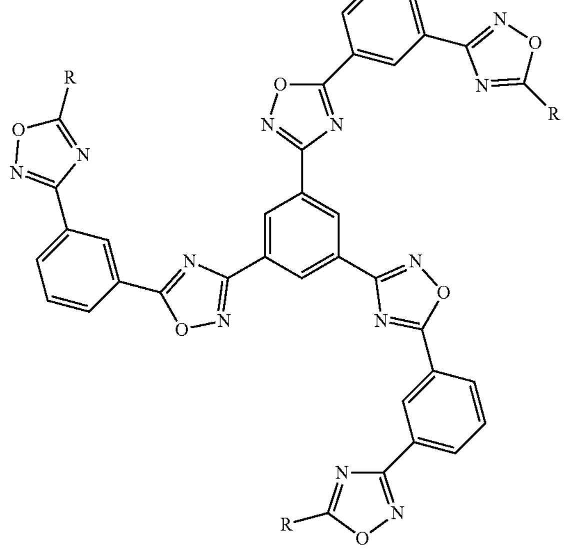

-continued

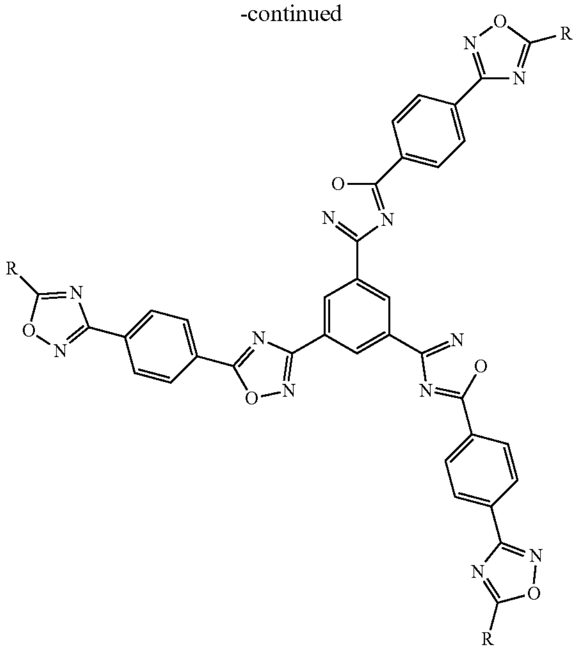

R =

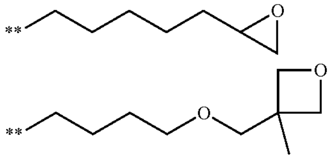

The compound represented by General Formula (XI) can be synthesized based on the methods described in JP1995-306317A (JP-H07-306317A), JP1995-281028A (JP-H07-281028A), JP2005-156822A, and JP2006-301614A.

The compound represented by General Formula (XII) can be synthesized based on the methods described in JP2010-244038A, JP2006-076992A, and JP2007-002220A.

<Optional Component>

(Curing Agent)

The curable composition may further contain a curing agent.

The type of the curing agent is not particularly limited, and the curing agent may be a compound which can cure the aforementioned polymerizable monomer. The curing agent is preferably a compound having a functional group selected from the group consisting of a hydroxy group, an amino group, a thiol group, an isocyanate group, a carboxy group, a (meth)acryloyl group, and a carboxylic acid anhydride group, and more preferably a compound having a functional group selected from the group consisting of a hydroxy group, a (meth)acryloyl group, an amino group, and a thiol group.

The curing agent preferably has two or more functional groups described above and more preferably has two or three functional groups described above.

Examples of the curing agent include an amine-based curing agent, a phenol-based curing agent, a guanidine-based curing agent, an imidazole-based curing agent, a naphthol-based curing agent, an acrylic curing agent, an acid anhydride-based curing agent, an active ester-based curing agent, a benzoxazine-based curing agent, a cyanate ester-based curing agent, and the like. Among these, an acrylic curing agent, a phenol-based curing agent, or an amine-based curing agent is preferable.

The content of the curing agent in the curable composition is not particularly limited, but is preferably 1% to 50% by mass and more preferably 1% to 30% by mass with respect to the total solid content in the curable composition.

(Curing Accelerator)

The curable composition may further contain a curing accelerator.

The type of the curing accelerator is not limited, and examples thereof include triphenylphosphine, 2-ethyl-4-methylimidazole, a boron trifluoride amine complex, 1-benzyl-2-methylimidazole, and those described in paragraph "0052" in JP2012-067225A.

The content of the curing accelerator in the curable composition is not particularly limited, but is preferably 0.1% to 20% by mass with respect to the total solid content in the curable composition.

(Polymerization Initiator)

The curable composition may further contain a polymerization initiator.

Particularly, in a case where the specific compound or the polymerizable monomer has a (meth)acryloyl group, it is preferable that the curable composition contains the polymerization initiator described in paragraph "0062" in JP2010-125782A and paragraph "0054" in JP2015-052710A.

The content of the polymerization initiator in the curable composition is not particularly limited, but is preferably 0.1% to 50% by mass with respect to the total solid content in the curable composition.

(Solvent)

The curable composition may further contain a solvent.

The type of the solvent is not particularly limited, but the solvent is preferably an organic solvent. Examples of the organic solvent include ethyl acetate, methyl ethyl ketone, dichloromethane, tetrahydrofuran, and the like.

<Method for Manufacturing Curable Composition>

The method for manufacturing the curable composition is not particularly limited, and known methods can be adopted. For example, the curable composition can be manufactured by mixing together the aforementioned various components (the inorganic substance, the specific compound, the polymerizable monomer, and the like) by a known method. At the time of mixing, the various components may be mixed at a time or mixed sequentially. In view of further improving the dispersibility, it is preferable that the manufacturing method includes a step of preparing a mixed solution containing at least the polymerizable monomer and the specific compound and adding an inorganic substance to the mixed solution.

<Method for Curing Curable Composition>

The method for curing the curable composition is not particularly limited, and according to the type of the polymerizable monomer, an optimal method is appropriately selected. The curing method may be a thermal curing reaction or a photocuring reaction for example, and is preferably a thermal curing reaction.

The heating temperature at the time of the thermal curing reaction is not particularly limited, and may be appropriately selected within a range of 50° C. to 200° C., for example. Furthermore, at the time of performing the thermal curing reaction, heating treatment may be performed plural times at different temperatures.

The curing reaction is preferably performed on the curable composition formed into a sheet. Specifically, coating may be performed using the curable composition, and the obtained coating film may be subjected to the curing reaction. At this time, press working may also be performed.

The curing reaction may be a semi-curing reaction. That is, the obtained cured substance may be in a so-called B stage state (semi-cured state).

In a case where the cured substance semi-cured as described above is disposed to contact a device or the like, and then permanently cured by heating and the like, the adhesiveness between a layer containing a thermally conductive material, which is the cured substance, and the device is further improved.

<Use>

The curable composition can be used for various uses. For example, the curable composition can be applied to various fields as an electrode material, a semiconductor material, a thermally conductive material, and the like. Particularly, the curable composition is preferably used for forming a thermally conductive material, and more preferably used as a thermally conductive material in the form of a sheet.

Hereinafter, the suitable use will be specifically described.

(Thermally Conductive Material)

The thermally conductive material according to the embodiment of the present invention can be prepared by curing the curable composition described above. That is, the curable composition can be used for forming the thermally conductive material. Regarding the preparation of the thermally conductive material including a curing reaction, "Highly Thermally Conductive Composite Material" (CMC Publishing CO., LTD., Yoshitaka Takezawa) can be referred to.

The thermally conductive material is a material having excellent thermal conductivity, and can be used as a heat dissipation material such as a heat dissipation sheet. For example, the thermally conductive material can be used for dissipating heat from various devices such as power semiconductor devices. More specifically, in a case where a device with a thermally conductive layer is prepared by disposing a thermally conductive layer containing the thermally conductive material on a device, the heat generated from the device can be efficiently dissipated by the thermally conductive layer.

The shape of the thermally conductive material is not particularly limited, and the thermally conductive material can be molded to have various shapes according to the use. Typically, the thermally conductive material is preferably in the form of a sheet.

The thermally conductive material may be in a completely cured state or a semi-cured state (B stage state described above). As described above, in a case where the thermally conductive material is in a semi-cured state, by disposing the thermally conductive material on a device and then performing a heating treatment thereon, a thermally conductive layer having excellent adhesiveness can be formed on the device.

EXAMPLES

Hereinafter, the present invention will be more specifically described based on examples. The materials, the amount and proportion of the materials used, the details of treatments, the procedure of treatments, and the like shown in the following examples can be appropriately changed within a range that does not depart from the gist of the present invention. Accordingly, the scope of the present invention is not limited to the following examples.

[Synthesis of Surface Modifier (Specific Compound)]

<Synthesis of Compound Having Structural Unit Represented by General Formula (1)>

A surface modifier (specific compound) C-2 was synthesized according to the following procedure. Surface modifiers (specific compounds) C-1, C-3, C-4, C-5, and C-6 were also synthesized based on the synthesis examples of the surface modifier C-2.

(Synthesis Example of Surface Modifier (Specific Compound) C-2)

Cyclohexanone (14.4 g) and isopropanol (3.6 g) were put into a 500 mL three-neck flask comprising a stirrer, a thermometer, a reflux cooling pipe, and a nitrogen gas introduction pipe, and heated to 85° C.

Then, a mixed solution, which was formed of 4-(4-acryloyloxybutoxy)benzoyloxyphenylborate (4.5 g), 2-(3-chloropropanoyloxy)ethyl methacrylate (10.5 g), cyclohexanone (33.6 g), isopropanol (8.4 g), and an azo polymerization initiator (V-601, manufactured by Wako Pure Chemical Industries, Ltd.) (0.58 g), was added dropwise to the flask at a constant speed such that the dropwise addition finished within 2.5 hours. After the dropwise addition ended, 1,3-propanediol (2.5 g) was further added to the flask, and the reaction solution in the flask was heated to 90° C. and continuously stirred for 4 hours.

Thereafter, p-methoxyphenol (0.2 g) was added to the reaction solution having been stirred, triethylamine (20.0 g) was further added thereto, and the reaction solution was stirred for 1.5 hours at 40° C. Subsequently, 200 mL of 1 N hydrochloric acid was added dropwise to the reaction solution, the obtained reaction solution was stirred for 30 minutes, and then an aqueous layer was removed from the reaction solution having been stirred. Then, the reaction solution from which the aqueous layer was removed was washed with 10% saline and dried over anhydrous magnesium sulfate, thereby obtaining 71.4 g of a cyclohexanone/isopropanol solution of a copolymer (surface modifier (specific compound) C-2) represented by Formula (C-2).

The weight-average molecular weight (Mw) of the copolymer C-2 was 15,000 (measured by gel permeation chromatography (EcoSEC HLC-8320GPC (manufactured by Tosoh Corporation)) by using NMP as an eluent and three TSKgel Super AWM-H columns (manufactured by Tosoh Corporation) as columns under the measurement conditions of a flow rate of 0.50 ml/min and a temperature of 40° C., calculated in terms of polystyrene).

C-2

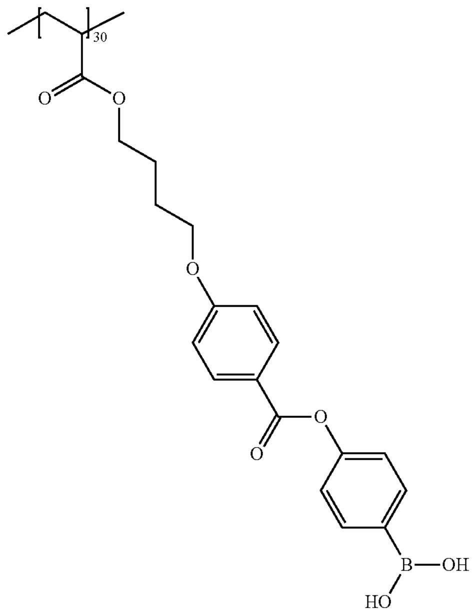

-continued

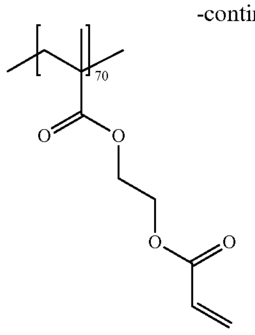

(Synthesis Example of Surface Modifier (Specific Compound) C-2')

A surface modifier (specific compound) C-2' having a weight-average molecular weight (Mw) of 3,000 was synthesized by the same method as the synthesis method of the surface modifier (specific compound) C-2, except that the amount of V-601 was changed to 2.3 g and the reaction temperature was changed to 90° C. The only difference between the surface modifier (specific compound) C-2' and the surface modifier (specific compound) C-2 is the weight-average molecular weight.

<Synthesis of Compound Represented by General Formula (2)>

A surface modifier (specific compound) C-7 was synthesized according to the following procedure. Surface modifiers (specific compounds) C-8 and C-9 were also synthesized based on the synthesis example of the following surface modifier C-7.

(Synthesis Example of Surface Modifier (Specific Compound) C-7)

In a 200 mL three-neck flask comprising a stirrer, a thermometer, and a reflux cooling pipe, dipentaerythritol hexakis(3-mercaptopropionate) (DPMP (3.5 g)), 4-(4-acryloyloxybutoxy)benzoyloxyphenylborate (5.2 g), and 1-ethyl-2-pyrrolidone (NEP (20.3 g)) were mixed together. Then, triethylamine (0.18 g) was added to the obtained mixed solution. Thereafter, the mixed solution was stirred for 12 hours at 65° C. Subsequently, the obtained reaction solution was added dropwise to a hexane (300 mL)/ethyl acetate (300 mL) solution, and the supernatant solution was removed. On the solid contents obtained after the removal of the supernatant solution, hexane washing and sprinkling washing were repeated, and then the solid contents were dried by being exposed to air with a temperature of 40° C., thereby obtaining 8.2 g of an intermediate of C-7.

Subsequently, The C-7 intermediate (2.5 g), methacrylic acid (0.94 g), and NEP (4.7 g) were put into a 100 mL three-neck flask comprising a stirrer, a thermometer, a reflux cooling pipe, and a nitrogen gas introduction pipe, and the mixed solution in the flask was heated to 90° C. Then, while the mixed solution was being stirred at 90° C., an azo polymerization initiator (V-601, manufactured by Wako Pure Chemical Industries, Ltd.) (0.1 g) was further added thereto. Thereafter, whenever the mixed solution was stirred for 1.5 hours, an azo polymerization initiator (V-601, manufactured by Wako Pure Chemical Industries, Ltd.) (0.1 g) was added thereto. The addition was repeated twice, and then the mixed solution was further stirred for 2 hours at 90° C.

Thereafter, glycidyl methacrylate (1.9 g), tetrabutyl ammonium bromide (0.27 g), and p-methoxyphenol (0.05 g) were added to the mixed solution, and the mixed solution was heated to 80° C. and then continuously stirred for 8 hours, thereby obtaining 8.4 g of an NEP solution of a polymer (surface modifier (specific compound) C-7) represented by C-7.

The weight-average molecular weight (Mw) of the polymer was 5,000 (measured by gel permeation chromatography (EcoSEC HLC-8320GPC (manufactured by Tosoh Corporation)) by using NMP as an eluent and three TSKgel Super AWM-H columns (manufactured by Tosoh Corporation) as columns under the measurement conditions of a flow rate of 0.50 ml/min and a temperature of 40° C., calculated in terms of polystyrene).

C-7

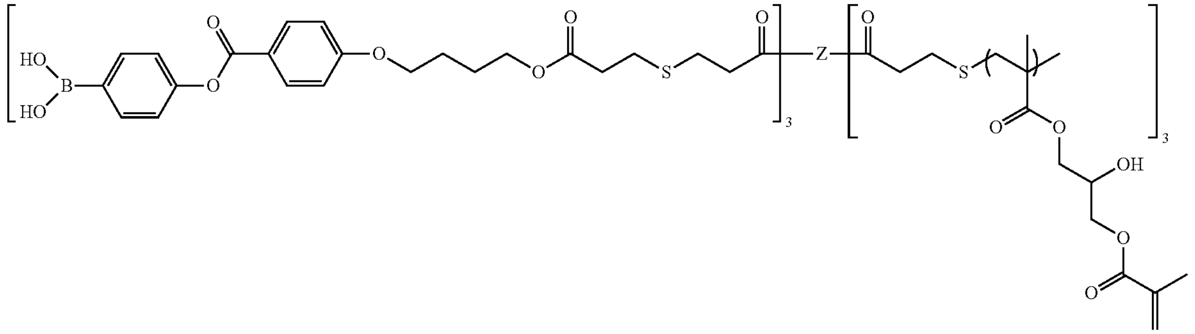

Z =

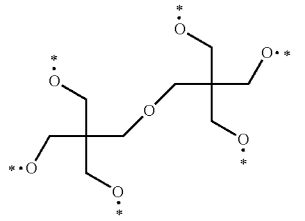

[Various Components]

Various components used in examples and comparative examples will be shown below.

<Polymerizable Monomer>

A-1

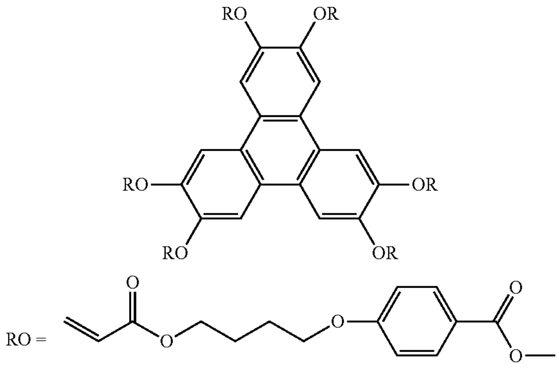

A-2

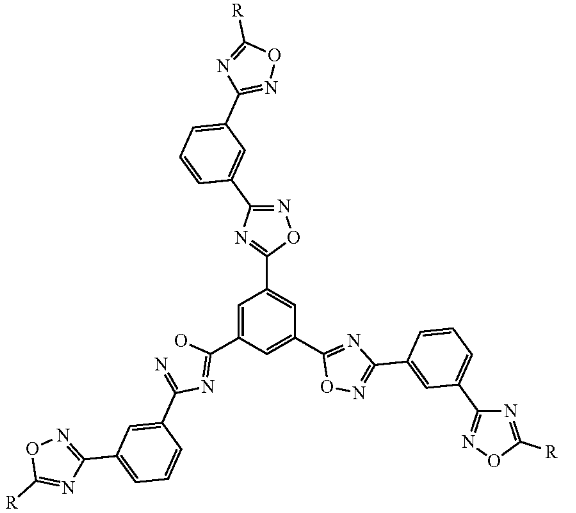

R =

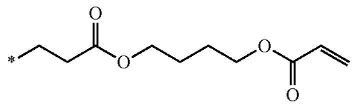

-continued

A-3

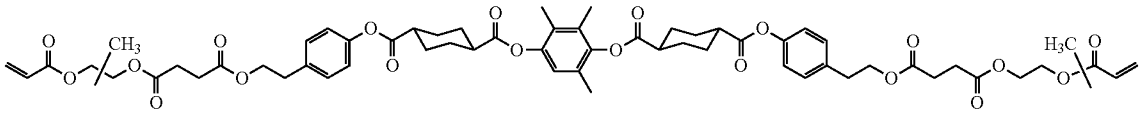

A-4

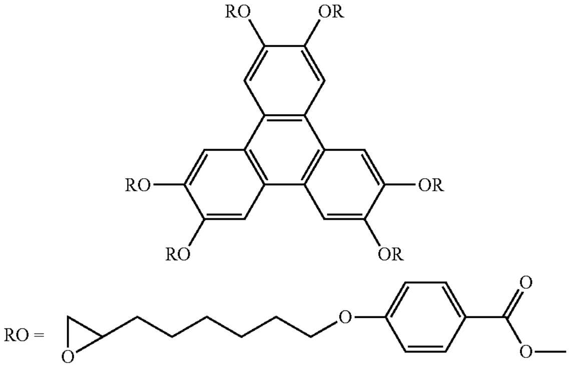

<Additive>

B-1

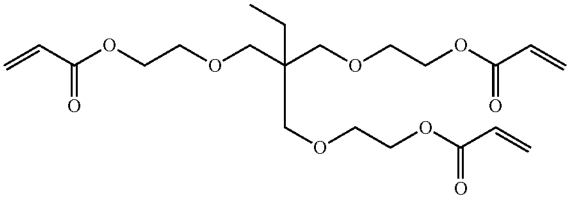

B-2

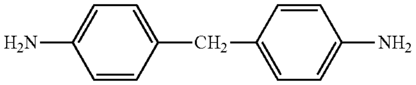

<Solvent>

Methyl ethyl ketone (MEK)

<Polymerization Initiator>

VAm-110 (oil-soluble azo polymerization initiator, manufactured by Wako Pure Chemical Industries, Ltd.)

V-40 (oil-soluble azo polymerization initiator, manufactured by Wako Pure Chemical Industries, Ltd.)

<Inorganic Substance>

SGPS (boron nitride, average particle diameter: 12 μm, manufactured by Denka Company Limited.)

X: HP-40 MF100 (boron nitride, average particle diameter: 43 μm, manufactured by Mizushima Ferroalloy Co., Ltd.)

Y: AA3 (alumina, average particle diameter: 3.3 μm, manufactured by Sumitomo Chemical Co., Ltd.)

Z: AA04 (alumina, average particle diameter: 0.4 μm, manufactured by Sumitomo Chemical Co., Ltd.)

<Surface Modifier (Specific Compound)>

C-1

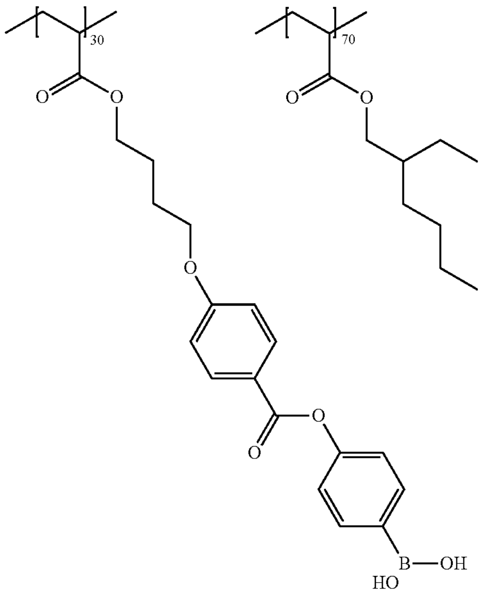

C-2

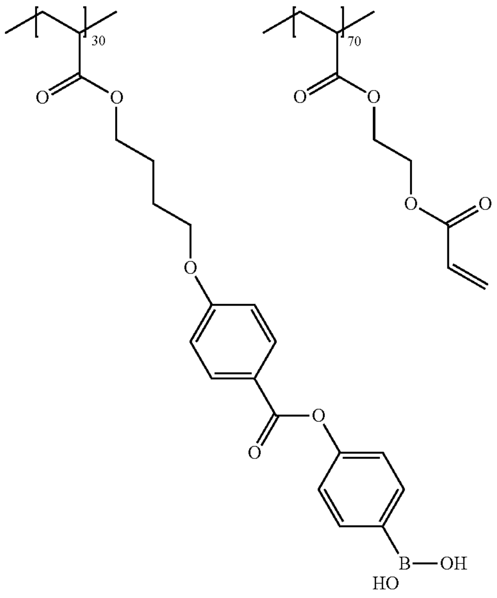

-continued
C-3
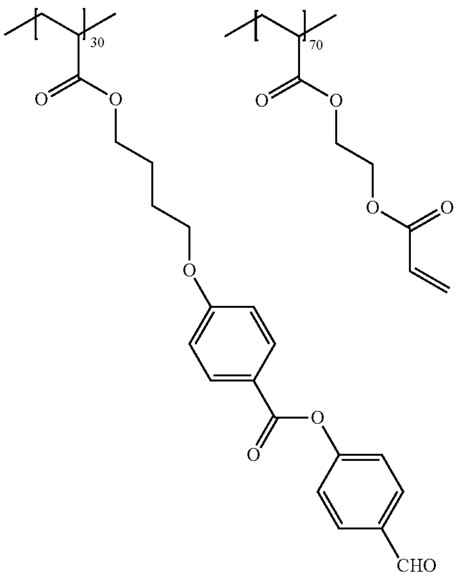
C-4
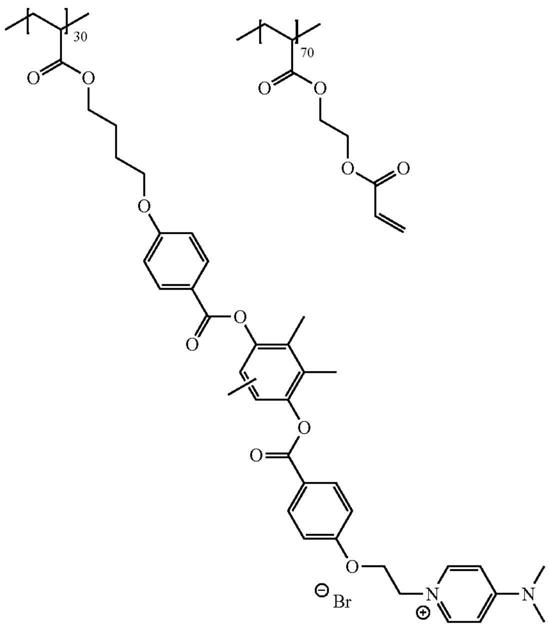
C-5
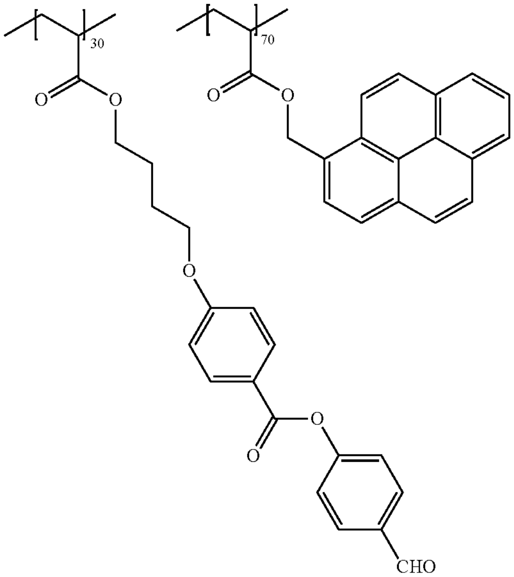
C-6
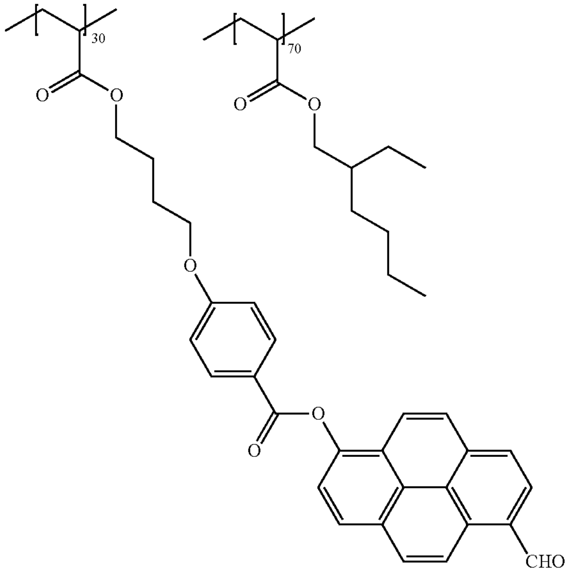
C-7
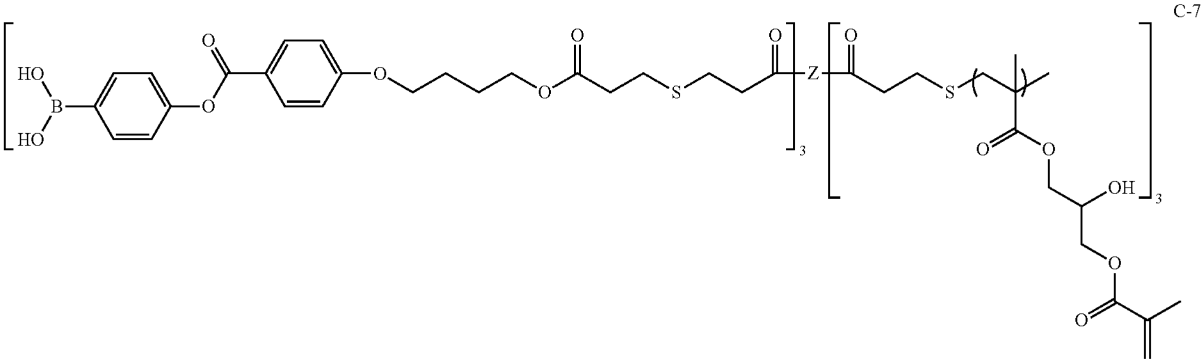

-continued
Z =
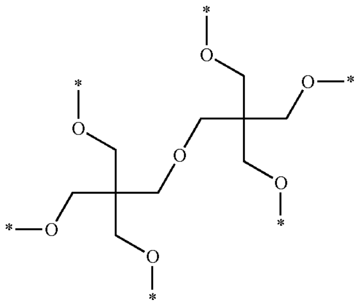
C-8
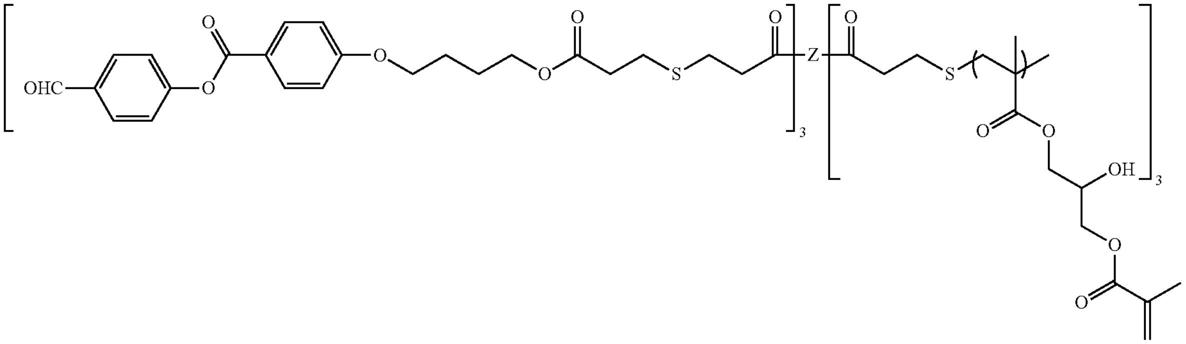
Z =
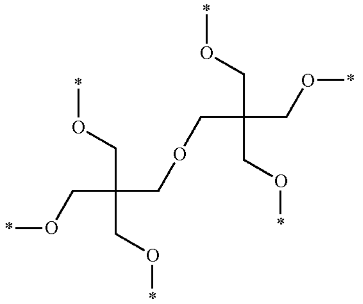
C-9
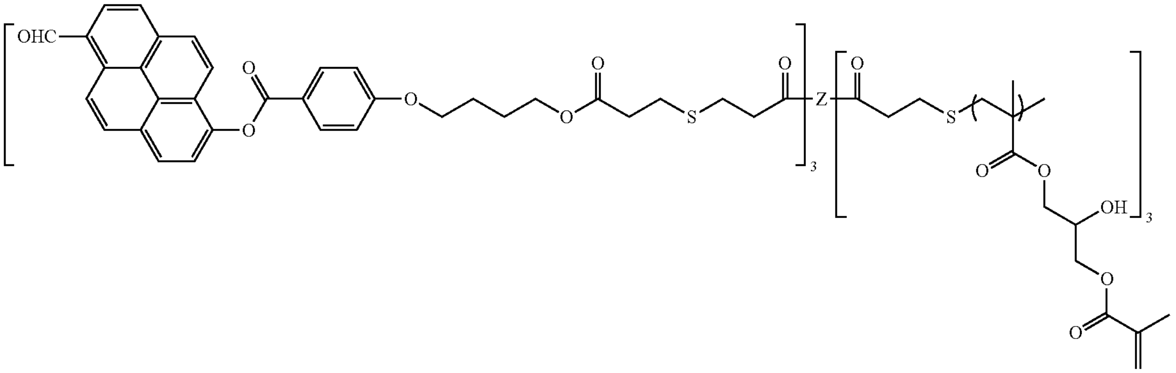
Z =
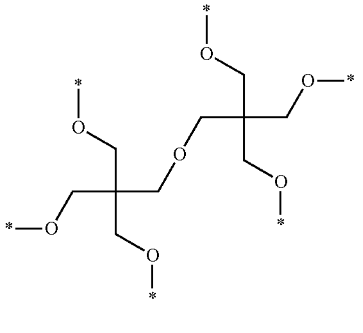

<Surface Modifier for Comparison>

In the following surface modifiers for comparison, "Me" represents a methyl group.

D-1

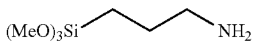

D-2

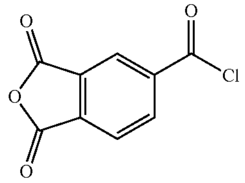

D-3

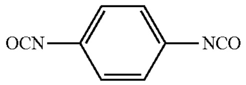

D-4

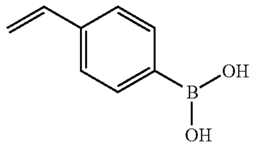

[Preparation and Evaluation of Curable Composition]

Example 1

Various components shown in the following Table 1 were mixed together in order of a polymerizable monomer, methyl ethyl ketone (MEK), an additive, a surface modifier (specific compound), and a polymerization initiator, and then an inorganic substance was added thereto. The obtained mixture was treated for 5 minutes by using a rotation-revolution mixer (manufactured by Thinky Corporation, AWATORI RENTARO ARE-310), thereby obtaining a curable composition 1. The final solid contents of the curable composition 1 were adjusted using MEK such that the concentration of solid contents described in Table 1 (described in the column of "Solvent") was achieved.

Then, by using an applicator, a release surface of a polyester film (NP-100A, manufactured by PANAC Corporation., film thickness: 100 μm) was coated with the curable composition 1 such that the thickness thereof became about 600 μm, and the film was left in the air for 1 hour, thereby obtaining a coating film 1.

Thereafter, the surface of the coating film 1 was covered with another polyester film and treated by being heat-pressed in a vacuum (heat plate temperature: 130° C., degree of vacuum ≤1 kPa, pressure: 12 MPa, treatment time: 5 hours) such that the coating film was cured, thereby obtaining a resin sheet. The polyester film on both surfaces of the resin sheet was peeled off, thereby obtaining a thermally conductive sheet 1 having a thickness of 250 μm.

(Evaluation)

The obtained thermally conductive sheet 1 was evaluated as below.

[1] Dispersibility Evaluation

By using the thermally conductive sheet 1, dispersibility was evaluated. Specifically, at any 5 positions in the thermally conductive sheet 1, the film thickness was measured, the standard deviation of the variation of the measured thicknesses was determined, and dispersibility was evaluated based on the following standards. A low standard deviation (in other words, a small variation of the film thicknesses) shows that the inorganic substance is excellent dispersed in the cured substance. In contrast, a high standard deviation (in other words, a large variation of the film thicknesses) means that aggregation or the like occurs in the cured substance, and surface asperities occur. That is, a high standard deviation shows that the dispersibility of the inorganic substance is poor.

The film thickness was measured using "ai-Phase Mobile 1u" manufactured by ai-Phase Co., Ltd.

(Evaluation Standards)

"A": The standard deviation is less than 5.

"B": The standard deviation is equal to or higher than 5 and less than 10.

"C": The standard deviation is equal to or higher than 10 and less than 30.

"D": The standard deviation is equal to or higher than 30.

The results are shown in Table 1.

[2] Thermal Conductivity Evaluation

Thermal conductivity was evaluated using the thermally conductive sheet 1. The thermal conductivity was measured by the following method and evaluated based on the following standards.

Measurement of Thermal Conductivity (W/mk)

(1) By using "ai-Phase Mobile 1u" manufactured by ai-Phase Co., Ltd., a coefficient of thermal diffusivity of the thermally conductive sheet 1 in a thickness direction was measured.

(2) By using a balance "XS204" ("solid specific gravity measuring kit" was used) manufactured by METTLER TOLEDO, the specific gravity of the thermally conductive sheet 1 was measured.

(3) By using "DSC320/6200" manufactured by Seiko Instruments Inc. and software of DSC7, the specific heat of the thermally conductive sheet 1 at 25° C. was determined under the heating condition of 10° C./min.

(4) The obtained coefficient of thermal diffusivity was multiplied by the specific gravity and the specific heat, thereby calculating the thermal conductivity of the thermally conductive sheet 1.

(Evaluation Standards)

"A": equal to or higher than 15 W/m·K

"B": equal to or higher than 12 W/m·K and less than 14 W/m·K

"C": equal to or higher than 9 W/m·K and less than 12 W/m·K

"D": less than 9 W/m·K

The results are shown in Table 1.

Examples 2 to 19 and Comparative Examples 1 to 4

Curable compositions of examples and comparative examples shown in the following Table 1 were obtained according to the same procedure as in Example 1. The final solid content of each of the curable compositions was adjusted using MEK such that the concentration of the solid contents (described in the column of "Solvent") described in Table 1 was achieved.

From the obtained curable compositions, thermally conductive sheets 2 to 19 and thermally conductive sheets 1 to 4 for comparison were prepared, and these were subjected to the same evaluation test as in Example 1. The results are shown in Table 1.

In Table 1, (numerical values) described in the column for each component mean the content (% by mass) of each component with respect to the total solid contents of the curable composition.

Furthermore, "Film thickness (μm)" described in Table 1 means the average film thickness of the thermally conductive sheet.

TABLE 1

| | Curable composition | | | | Surface modifier (specific compound) | | | Evaluation | | |
|---|---|---|---|---|---|---|---|---|---|---|
| | Polymerizable monomer (% by mass) | Additive (% by mass) | Polymerization initiator (% by mass) | Inorganic substance (% by mass) | Type (% by mass) | Molecular weight (or weight-average molecular weight) | Solvent (concentration of solid contents (% by mass)) | Dispersibility | Thermal conductivity | Film thickness [μm] |
| Example 1 | A-1(36) | B-1(2) | VAm-110(1) | SGPS(60) | C-1(1) | 15,000 | MEK(40) | A | C | 250 |
| Example 2 | A-1(36) | B-1(2) | VAm-110(1) | SGPS(60) | C-2(1) | 15,000 | MEK(40) | A | B | 250 |
| Example 3 | A-1(36) | B-1(2) | VAm-110(1) | SGPS(60) | C-3(1) | 15,000 | MEK(40) | A | B | 250 |
| Example 4 | A-1(36) | B-1(2) | VAm-110(1) | SGPS(60) | C-4(1) | 15,000 | MEK(40) | A | B | 250 |
| Example 5 | A-2(38) | N/A | VAm-110(1) | SGPS(60) | C-2(1) | 15,000 | MEK(40) | A | B | 250 |
| Example 6 | A-3(38) | N/A | VAm-110(1) | SGPS(60) | C-2(1) | 15,000 | MEK(40) | A | B | 250 |
| Example 7 | A-4(20) | B-2(19) | N/A | SGPS(60) | C-2(1) | 15,000 | MEK(40) | A | B | 300 |
| Example 8 | A-1(36) | B-1(2) | VAm-110(1) | SGPS(60) | C-5(1) | 5,000 | MEK(40) | A | B | 250 |
| Example 9 | A-1(36) | B-1(2) | V-40(1) | SGPS(60) | C-5(1) | 5,000 | MEK(40) | A | B | 250 |
| Example 10 | A-1(34) | B-1(2) | V-40(3) | SGPS(60) | C-5(1) | 5,000 | MEK(40) | A | B | 250 |
| Example 11 | A-1(36) | B-1(2) | VAm-110(1) | SGPS(60) | C-6(1) | 15,000 | MEK(40) | A | A | 250 |
| Example 12 | A-1(36) | B-1(2) | VAm-110(1) | SGPS(60) | C-7(1) | 5,000 | MEK(40) | A | B | 250 |
| Example 13 | A-1(36) | B-1(2) | VAm-110(1) | SGPS(60) | C-8(1) | 15,000 | MEK(40) | A | B | 250 |
| Example 14 | A-1(36) | B-1(2) | VAm-110(1) | SGPS(60) | C-9(1) | 15,000 | MEK(40) | A | A | 250 |
| Example 15 | A-1(31) | B-1(2) | VAm-110(1) | SGPS(65) | C-2(1) | 15,000 | MEK(40) | A | A | 230 |
| Example 16 | A-1(26) | B-1(2) | VAm-110(1) | SGPS(70) | C-2(1) | 15,000 | MEK(40) | A | A | 225 |
| Example 17 | A-1(26) | B-1(2) | VAm-110(1) | HP-40 MF100(70) | C-2(1) | 15,000 | MEK(40) | A | A | 250 |
| Example 18 | A-1(26) | B-1(2) | VAm-110(1) | X/Y/ Z(42/21/7) | C-2(1) | 15,000 | MEK(40) | A | A | 250 |
| Example 19 | A-1(36) | B-1(2) | VAm-110(1) | SGPS(60) | C'-2(1) | 3,000 | MEK(40) | B | C | 310 |
| Comparative Example 1 | A-1(36) | B-1(2) | VAm-110(1) | SGPS(60) | D-1(1) | 179 | MEK(40) | D | D | 350 |
| Comparative Example 2 | A-1(36) | B-1(2) | VAm-110(1) | SGPS(60) | D-2(1) | 211 | MEK(40) | D | D | 400 |
| Comparative Example 3 | A-1(36) | B-1(2) | VAm-110(1) | SGPS(60) | D-3(1) | 160 | MEK(40) | D | D | 400 |
| Comparative Example 4 | A-1(26) | B-1(2) | VAm-110(1) | SGPS(70) | D-4(1) | 148 | MEK(40) | C | D | 350 |

It was confirmed that in the cured substance obtained from each of the curable compositions of examples, the inorganic substance exhibits excellent dispersibility.

Furthermore, from the comparison between Example 1 and Example 2, it was confirmed that in a case where the specific compound has a polymerizable group (preferably, any polymerizable group selected from the group consisting of a (meth)acryloyl group, an oxiranyl group, an oxetanyl group, and a vinyl group), the thermal conductivity is further improved.

From the comparison between Example 1 and Example 11 and between Example 13 and Example 14, it was confirmed that in a case where the specific compound has a fused ring structure in a molecule (in other words, in a case where the specific compound has a fused ring group formed by the induction of a fused ring), the thermal conductivity is further improved.

From the results of Example 2 and Examples 15 to 18, it was confirmed that even though each of the curable compositions of examples contains a inorganic substance in an amount of 40% to 85% by mass (preferably 50% to 85% by mass, more preferably 55% to 75% by mass, and even more preferably 65% to 75% by mass) with respect to the total solid content, the dispersibility of the inorganic substance in the cured substance does not deteriorate.

From the results of Examples 2 to 14 and Example 19, it was confirmed that in a case where the molecular weight of the specific compound is equal to or greater than 4,000, the dispersibility of the inorganic substance in the cured substance is further improved, and the thermal conductivity is further improved.

It was confirmed that in the cured substance obtained from each of the curable compositions of comparative examples, the inorganic substance exhibits poor dispersibility.

What is claimed is:

1. A curable composition comprising:

an inorganic nitride;

a compound has a weight-average molecular weight equal to or greater than 1,000; and a polymerizable monomer, wherein the compound is a compound having a structural unit represented by General Formula (1) or a compound represented by General Formula (2), (1)

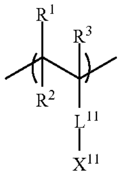

(2)

$A^{21}-(L^{21}-X^{21})_l$ (3)

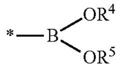

(4)

$*-CHO$ (5)

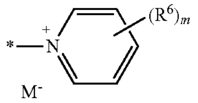

in General Formula (1), $R^1$, $R^2$, and $R^3$ each independently represent a hydrogen atom or a substituent, $X^{11}$ represents any group selected from General Formula (3), (4), or (5), $L^{11}$ represents a single bond or a divalent linking group, in General Formula (3), $R^4$ and $R^5$ each independently represent a hydrogen atom or a substituent selected from the group consisting of an aliphatic hydrocarbon group, an aromatic hydrocarbon ring group, and an aromatic heterocyclic group, and in a case where $R^4$ and $R^5$ represent a substituent, $R^4$ and $R^5$ may form a ring by being bonded to each other, in General Formula (5), $R^6$ represents a substituent, m represents an integer of 0 to 5, $M^-$ represents a counter anion, and in a case where there is a plurality of $R^6$'s, $R^6$'s adjacent to each other may form a ring by being bonded to each other, in General Formulae (3) to (5), * represents a position bonded to $L^{11}$ or $L^{21}$, and in General Formula (2), $X^{21}$ represents any group selected from General Formula (3), (4), or (5), $A^{21}$ represents an 1-valent substituent, 1 represents an integer equal to or greater than 2, and $L^{21}$ represents a single bond or a divalent linking group.

2. The curable composition according to claim 1, wherein the compound having a structural unit represented by General Formula (1) further has a structural unit represented by General Formula (6), (6)

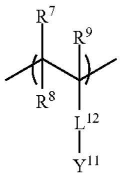

in General Formula (6), $R^7$, $R^8$, and $R^9$ each independently represent a hydrogen atom or a substituent, $L^{12}$ represents a single bond or a divalent linking group, and $Y^{11}$ represents a substituent.

3. The curable composition according to claim 2, wherein the compound having a structural unit represented by General Formula (1) has a structural unit represented by General Formula (6) in which $Y^{11}$ represents a fused ring group formed by the induction of a fused ring.

4. The curable composition according to claim 2, wherein the compound having a structural unit represented by General Formula (1) has a structural unit represented by General Formula (6) in which $Y^{11}$ is any polymerizable group selected from the group consisting of an acryloyl group, a methacryloyl group, an oxiranyl group, an oxetanyl group, and a vinyl group.

5. The curable composition according to claim 1, wherein $L^{11}$ represents a divalent linking group represented by General Formula (8), $$*1\text{-}L^{13}\text{-}(T^{11}\text{-}Z^{11})_p\text{-}*2 \qquad (8)$$

in General Formula (8), $L^{13}$ represents a single bond or a divalent linking group, $T^{11}$ each independently represents a divalent aromatic hydrocarbon ring group or a divalent aromatic heterocyclic group, $Z^{11}$ each independently represents a single bond or a divalent linking group, p represents an integer of 1 to 5, in a case where p is equal to or greater than 2, a plurality of $T^{11}$'s and $Z^{11}$'s may be the same as or different from each other respectively, *1 represents a position bonded to the main chain of the compound having a structural unit represented by General Formula (1), and *2 represents a position bonded to $X^{11}$.

6. The curable composition according to claim 5, wherein each of a divalent aromatic hydrocarbon ring group and a divalent aromatic heterocyclic group represented by $T^{11}$ is monocyclic or fused polycyclic.

7. The curable composition according to claim 1, wherein $X^{11}$ is a group represented by General Formula (3) or General Formula (4).

8. The curable composition according to claim 1, wherein the compound represented by General Formula (2) is a compound represented by General Formula (7), $$(Y^{21}\text{-}L^{22})_n A^{22}(L^{21}\text{-}X^{21})_l \qquad (7)$$

in General Formula (7), $L^{21}$, $X^{21}$, and 1 have the same definition as $L^{21}$, $X^{21}$, and 1 in General Formula (2) respectively, $A^{22}$ represents an (1+n)-valent substituent, $L^{22}$ represents a single bond or a divalent linking group, $Y^{21}$ represents a substituent, and n represents an integer equal to or greater than 1.

9. The curable composition according to claim 8, wherein $Y^{21}$ represents a polymer chain, and the polymer chain has a structural unit represented by General Formula (10), (10)

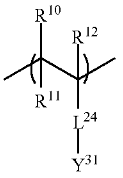

in General Formula (10), $R^{10}$, $R^{11}$, and $R^{12}$ each independently represent a hydrogen atom or a substituent, $L^{24}$ represents a single bond or a divalent linking group, and $Y^{31}$ represents a substituent.

10. The curable composition according to claim 9, wherein the polymer chain has a structural unit represented by General Formula (10) in which $Y^{31}$ represents a fused ring group formed by the induction of a fused ring.

11. The curable composition according to claim 9, wherein the polymer chain has a structural unit represented by General Formula (10) in which $Y^{31}$ represents any polymerizable group selected from the group consisting of an acryloyl group, a methacryloyl group, an oxiranyl group, an oxetanyl group, and a vinyl group.

12. The curable composition according to claim 1, wherein $L^{21}$ each independently represents a divalent linking group represented by General Formula (9), $$*3\text{-}L^{23}\text{-}(T^{21}\text{-}Z^{21})_q\text{-}*4 \quad (9)$$

in General Formula (9), $L^{23}$ represents a single bond or a divalent linking group, $T^{21}$ each independently represents a divalent aromatic hydrocarbon ring group or a divalent aromatic heterocyclic group, $Z^{21}$ each independently represents a single bond or a divalent linking group, q represents an integer of 1 to 5, in a case where q is equal to or greater than 2, a plurality of $T^{21}$'s and $Z^{21}$'s may be the same as or different from each other respectively, *3 represents a position bonded to $A^{21}$ or $A^{22}$, and *4 represents a position bonded to $X^{21}$.

13. The curable composition according to claim 12, wherein each of the divalent aromatic hydrocarbon ring group or the divalent aromatic heterocyclic group represented by $T^{21}$ is monocyclic or fused polycyclic.

14. The curable composition according to claim 1, wherein $X^{21}$ is a group represented by General Formula (3) or General Formula (4).

15. The curable composition according to claim 1, wherein the inorganic nitride contains at least one kind of compound selected from the group consisting of boron nitride and aluminum nitride.

16. The curable composition according to claim 1, wherein the polymerizable monomer has a group selected from the group consisting of an acryloyl group, a methacryloyl group, an oxiranyl group, and a vinyl group.

17. The curable composition according to claim 1, wherein the polymerizable monomer or a cured substance of the polymerizable monomer exhibits liquid crystallinity.

18. A thermally conductive material formed by curing the curable composition according to claim 1.

19. The thermally conductive material according to claim 18 that is in the form of a sheet.

20. The thermally conductive material according to claim 18 that is used in a heat dissipation sheet.

21. A device with a thermally conductive layer comprising:

a device; and a thermally conductive layer which is disposed on the device and contains the thermally conductive material according to claim 18.

* * * * *